US010594329B1

United States Patent
Elkholy

(10) Patent No.: US 10,594,329 B1
(45) Date of Patent: Mar. 17, 2020

(54) ADAPTIVE NON-LINEARITY IDENTIFICATION AND COMPENSATION USING ORTHOGONAL FUNCTIONS IN A MIXED SIGNAL CIRCUIT

(71) Applicant: Phasebits, Inc., Champaign, IL (US)

(72) Inventor: Ahmed Elkholy, Savoy, IL (US)

(73) Assignee: Si-Ware Systems S.A.E., Cairo (EG)

(*) Notice: Subject to any disclaimer, the term of this patent is extended or adjusted under 35 U.S.C. 154(b) by 0 days.

(21) Appl. No.: 16/213,598

(22) Filed: Dec. 7, 2018

(51) Int. Cl.
| H03L 7/093 | (2006.01) |
| H03L 7/197 | (2006.01) |
| H03L 7/099 | (2006.01) |
| H03M 3/00 | (2006.01) |

(52) U.S. Cl.
CPC .......... *H03L 7/1976* (2013.01); *H03L 7/093* (2013.01); *H03L 7/0991* (2013.01); *H03M 3/358* (2013.01); *H03M 3/368* (2013.01)

(58) Field of Classification Search
CPC ....... H03L 7/085; H03L 7/093; H03L 7/0991; H03L 7/197; H03L 7/1974; H03L 7/1976; H03M 3/322; H03M 3/358; H03M 3/368; H03M 3/378
See application file for complete search history.

(56) References Cited

U.S. PATENT DOCUMENTS

| 7,999,623 | B2* | 8/2011 | Lin ...................... H03L 7/1976 327/156 |
| 8,497,716 | B2* | 7/2013 | Zhang ................... H03L 7/1976 327/147 |
| 8,791,733 | B2* | 7/2014 | Tertinek ................ H03L 7/1976 327/156 |
| 9,246,500 | B2* | 1/2016 | Perrott .................... H03L 7/093 |
| 9,264,211 | B1 | 2/2016 | Jenkins |
| 9,344,271 | B1 | 5/2016 | Dusatko |
| 9,490,818 | B2 | 11/2016 | Perrott |
| 9,548,750 | B2* | 1/2017 | Tertinek ................. H03L 7/085 |
| 9,780,945 | B1* | 10/2017 | Avivi .................... H04B 15/02 |
| 10,419,007 | B2* | 9/2019 | Gao ......................... H03L 7/18 |

(Continued)

OTHER PUBLICATIONS

R. Adams and K. Q. Nguyen, "A 113-dB SNR oversampling DAC with segmented noise-shaped scrambling," IEEE Journal of Solid-State Circuits, vol. 33, No. 12, pp. 1871-1878, Dec. 1998.

(Continued)

*Primary Examiner* — Patrick O Neill
(74) *Attorney, Agent, or Firm* — gPatent LLC; Stuart T Auvinen

(57) ABSTRACT

A feedback divider in a mixed-signal circuit is modulated by a frequency control word controlling a delta-sigma modulator. An accumulated quantization error from the delta-sigma modulator is compared to a residual error in the circuit by a Least-Mean Square (LMS) correlator for gain calibration to adjust for linear errors. Upper bits of the accumulated quantization error access a lookup table to find two outputs of the compensation function that are interpolated between using lower bits of the accumulated quantization error. The interpolated result is an adjustment subtracted from the loop to compensate for non-linear errors. A set of orthogonal kernels is generated from the accumulated quantization error and calibrated using another LMS correlator and inverse transformed to generate updates to the non-linear compensation function in the lookup table. The kernels can be Walsh Hadamard (WH) and the inverse transformer an inverse WH transformer.

16 Claims, 20 Drawing Sheets

(56) References Cited

U.S. PATENT DOCUMENTS

2011/0169578 A1* 7/2011 Lucas .................. H03L 7/1976
                                                        331/25
2014/0097875 A1    4/2014 Tertinek et al.

OTHER PUBLICATIONS

M. Gupta and B. Song, "A 1.8-GHz Spur-Cancelled Fractional-N Frequency Synthesizer With LMS-Based DAC Gain Calibration," IEEE Journal of Solid-State Circuits, vol. 41, No. 12, pp. 2842-2851, Dec. 2006.

A. Swaminathan, K. J. Wang, and I. Galton, "A wide-bandwidth 2.4 GHz ISM band fractional-N PLL with adaptive phase noise cancellation," IEEE J. Solid-State Circuits, vol. 42, pp. 2639-2650, Dec. 2007.

C.-M. Hsu, M. Z. Straayer, and M. H. Perrott, "A low-noise wide-BW 3.6-GHz digital ΔΣ fractional-N frequency synthesizer with a noise-shaping time-to-digital converter and quantization noise cancellation," IEEE J. Solid-State Circuits, vol. 43, No. 12, pp. 2776-2786, Dec. 2008.

D. Tasca, M. Zanuso, G. Marzin, S. Levantino, C. Samori, and A. L. Lacaita, "A 2.9-4.0-GHz fractional-N digital PLL with bang-bang phase detector and 560-fs rms integrated jitter at 4.5-mW power," IEEE J. Solid-State Circuits, vol. 46, No. 12, pp. 2745-2758, Dec. 2011.

A. Elkholy, T. Anand, W. S. Choi, A. Elshazly, and P. K. Hanumolu, "A 3.7 mW low-noise wide-bandwidth 4.5 GHz digital fractional-N PLL using time amplifier-based TDC," IEEE J. Solid-State Circuits, vol. 50, No. 4, pp. 867-881, Apr. 2015.

R. Raich, Hua Qian and G. T. Zhou, "Orthogonal polynomials for power amplifier modeling and predistorter design", IEEE Transactions on Vehicular Technology, vol. 53, No. 5, pp. 1468-1479, Sep. 2004.

J. E. Cousseau, J. L. Figueroa, S. Werner and T. I. Laakso, "Efficient Nonlinear Wiener Model Identification Using a Complex-Valued Simplicial Canonical Piecewise Linear Filter", IEEE Transactions on Signal Processing, vol. 55, No. 5, pp. 1780-1792, May 2007.

* cited by examiner

PRIOR-ART

ADAPTIVE NON-LINEARITY IDENTIFICATION AND COMPENSATION USING ORTHOGONAL FUNCTIONS IN A MIXED SIGNAL CIRCUIT

FIELD OF THE INVENTION

This invention relates to mixed-signal Integrated Circuits (ICs) and more particularly to non-linearity identification and compensation of building blocks for a mixed-signal IC.

BACKGROUND OF THE INVENTION

The ever-increasing data rates of wireline and wireless communication systems poses stringent performance requirements on their mixed-signal IC sub-systems. In particular, there is a great demand for high-resolution data converters at higher sampling rates, and high-performance frequency synthesizers with stringent phase-noise and spurious performance requirements. Delta-Sigma ($\Delta\Sigma$) Digital-to-Analog Converters (DACs) leverage noise shaping and high oversampling ratio to realize a high-resolution (on the order of 20-bits), which cannot be readily achieved using a conventional DAC.

Similarly, $\Delta\Sigma$ Fractional-N Phase Locked Loops (FN-PLLs) leverage noise shaping and high oversampling ratio to realize a very fine frequency synthesis capability (on the order of 20-bits). In both of these examples, the $\Delta\Sigma$ noise-shaping modulator reduces the word length (m) of its digital input signal, x[k], to a few (1-6) bits, and the large amount of quantization noise generated is shaped to a high-frequency to make the in-band noise negligible. The out-of-band quantization noise is suppressed by a dedicated low-pass filter in case of a $\Delta\Sigma$ DAC or by loop dynamics in case of a $\Delta\Sigma$ FN-PLL.

In practice, non-linearity of the circuit building blocks poses a bottleneck to realize high-performance $\Delta\Sigma$ DACs and $\Delta\Sigma$ FN-PLLs. The non-linearity causes shaped out-of-band noise to fold intermodulation products into the baseband and limits the Spurious Free Dynamic Range (SFDR) and Signal-to-Noise plus Distortion Ratio (SNDR) of $\Delta\Sigma$ DACs and phase noise and spurious performance of $\Delta\Sigma$ FN-PLLs.

Non-Linearity Impact on $\Delta\Sigma$ Quantization Noise Cancellation $\Delta\Sigma$ DACs using a 1-bit DAC unit offer inherently high-linearity but at the expense of a large quantization error. Consequently, achieving high in-band Signal-to-Noise Ratio (SNR) requires a very large oversampling ratio. Therefore, its usage is typically limited to low-bandwidth applications like audio and sensor interfaces. Using a multi-bit DAC effectively reduces the amount of quantization noise and considerably relaxes the oversampling ratio required to achieve high-bandwidth. But this comes at the expense of high sensitivity to the mismatch between DAC unit cells.

To improve matching between DAC unit cells, thermometer coding implementation is recommended. To get a better tradeoff between linearity and area, as the number of bits in the DAC increases, DAC implementation is usually segmented into two smaller DACs: an $m_1$-bit coarse DAC and an $m_2$-bit fine DAC. While the original modulator output $x_0[k]$ contains shaped noise, the split coarse $x_1[k]$, and fine $x_2[k]$, signals contain non-shaped noise as well as distortion. Adding $DAC_1$ and $DAC_2$ outputs with the proper gain ratio ($g_{DAC1}=2^{m_2}g_{DAC2}$) cancels these distortion components and restores the noise shaping properties. But in the presence of a gain error between the two DACs, noise and distortion from each individual path will leak into the output and cause severe performance degradation.

A segmented $\Delta\Sigma$ DAC architecture may use a Quantization Noise Cancellation (QNC) technique to overcome this limitation. By re-quantizing the original modulator output $x_0[k]$ using a second $\Delta\Sigma$ modulator to drive $DAC_1$, coarse $DAC_1$ control $x_1[k]$ now contains noise-shaped components besides the signal. Since signal $x_2[k]$ is the difference between the input and output of the $\Delta\Sigma$ modulator, it represents only the shaped quantization noise and does not contain any signal components. As a result, any spectral leakage due to improper gain ratio results only into noise-shaped signal that contributes little in-band energy.

Similarly, QNC techniques may be used to improve the performance and extend the bandwidth of $\Delta\Sigma$ fractional-N phase-locked loops (FN-PLLs). FIG. 1 shows a prior-art analog FN-PLL. Phase-Frequency Detector and Charge Pump (PFD/CP) 102 compares a reference clock REF to a divided clock DIV to control a charge pump that charges loop filter 104 go generate control voltage Vc that controls the frequency generated by Voltage-Controlled Oscillator (VCO) 106. VCO 106 output OUT is fed back to Multi-Modulus Divider (MMD) 108 to generate the divided clock DIV. MMD 108 can be a $\Delta\Sigma$ fractional divider in the feedback path. VCO 106 generates an output signal, OUT, of frequency $F_{OUT}=(N_{DIV}+\alpha_{DIV})F_{REF}$, where $N_{DIV}$ is a positive integer, $\alpha_{DIV}$ is a fractional value between 0 and 1, and $F_{REF}$ is the frequency of the reference clock signal REF. Fractional-N operation is achieved by dithering the feedback multi-modulus divider MMD 108 using $\Delta\Sigma$ modulator 110, where the average of the dithered signal $x_{DIV}[k]$ corresponds to the desired fractional factor $\alpha_{DIV}$. The $\Delta\Sigma$ fractional divider, MMD 108, resembles a digital-to-frequency converter, where its shaped frequency quantization noise can be cancelled as for $\Delta\Sigma$-DACs. Here, the quantization noise cancellation path, $\Delta\Sigma$ QNC 120, includes adder 112, digital accumulator 114 for frequency-to-phase conversion, and current DAC 116 to cancel quantization noise at the charge pump output using adder 118. In practice, the gain mismatch between DAC 116 and the signal path through PFD/CP 102 results in an imperfect QNC.

The fractional divider quantization noise impacts both analog and digital FN-PLLs alike. QNC techniques for digital FN-PLLs may use Time-to-Digital Converters (TDCs) and Digital-to-Time Converters (DTCs). Even though the cancellation gain path can be accurately calibrated using a Least-Mean Square (LMS) technique, each of the PFD/CP signal and DAC noise cancellation paths has different non-linear characteristics, namely $p_{CP}(x)$ and $p_{DAC}(x)$, respectively. The non-linearity of these blocks can significantly limit the overall phase noise and spurious performance of FN-PLLs. Similarly, coarse and fine DACs of a segmented $\Delta\Sigma$-DAC architecture can have different non-linear characteristics, namely $p_{DAC1}(x)$ and $p_{DAC2}(x)$, and severely degrade SNDR and SFDR of the overall DAC.

The non-linearity of the signal path or noise cancellation path poses a bottleneck to realize high-performance $\Delta\Sigma$ DACs and $\Delta\Sigma$ FN-PLLs. The non-linearity causes shaped noise and tones in the high-frequency region of the multi-bit spectrum to fold intermodulation products into the baseband. The in-band distortion products cannot be readily removed by simple linear filters. Reducing system bandwidth may or may not significantly improve the SNDR and SFDR of $\Delta\Sigma$ DACs and phase noise and spurious performance of $\Delta\Sigma$ FN-PLLs. In this case, it is the non-linearity, rather than the quantization noise, that limits the performance of the system.

What is desired is adaptive non-linearity identification and compensation techniques that can be leveraged in the implementation of data converters, PLLs, and frequency synthesizers to achieve improved performance. An adaptive non-linearity identification and compensation circuit that is useful for various analog/mixed-signal/RF integrated circuits (ICs) building blocks is desired, including for clock generators, clock and data recovery (CDR), phase interpolators, voltage/current amplifiers, transimpedance amplifiers (TIAs), and power amplifiers (PAs).

DETAILED DESCRIPTION

The present invention relates to an improvement in mixed-signal circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

The inventor proposes methods and apparatus to identify and compensate the non-linearity of precision analog and mixed-signal building blocks such as $\Delta\Sigma$ DACs and $\Delta\Sigma$ FN-PLLs. In general, any arbitrary memoryless non-linearity of a given circuit block can be described as a function $p(x)$ of its input signal x, where x is defined over a closed region $x \in [-x_p, +x_p]$. In the context of DACs, the input is a discrete-time digital signal, x[k], and the non-linearity function p(x) represents DAC Integral Non-Linearity (INL). This INL function principally defines the deviation of the DAC from its ideal linear behavior. For a perfectly linear DAC, $p(x)=0$ for any input x.

Figure 2B:
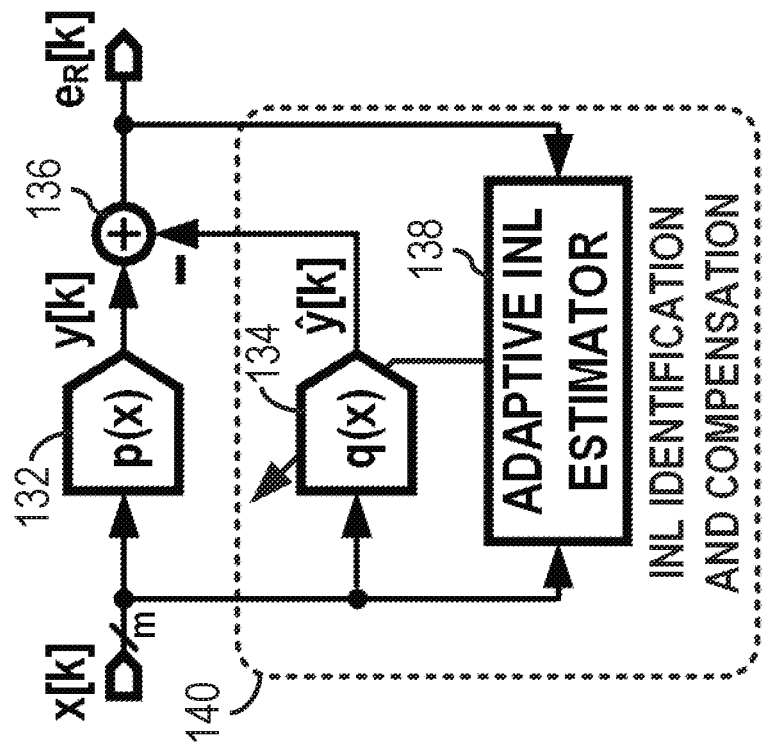
FIGS. 2A-2B show identification and estimation of an Integral Non-Linearity (INL) error function.
Figure 2A:
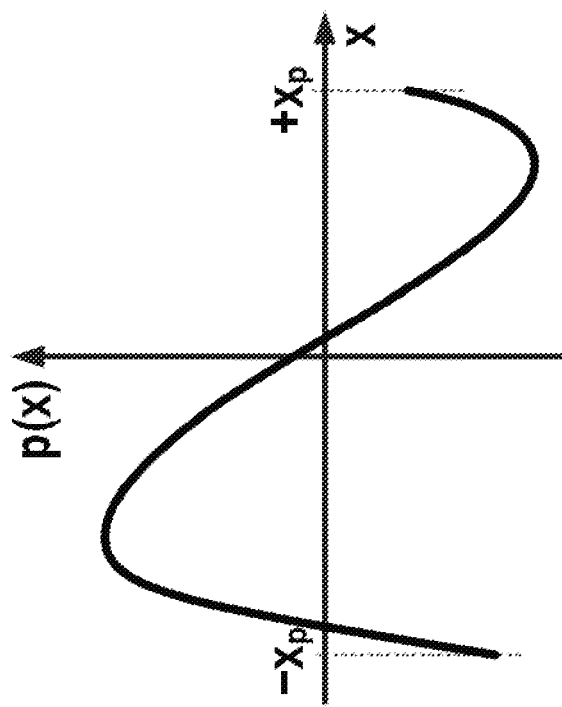

FIGS. 2A-2B show identification and estimation of an Integral Non-Linearity (INL) error function. FIG. 2A is a graph showing an example of a best-fit straight-line INL function of a DAC, p(x). Conceptually, if the inventor can identify the unwanted non-linearity function p(x) accurately, the inventor can compensate for it based on an approximated synthesized compensation function q(x) as shown in FIG. 2B. Subtracting the compensation signal, ŷ[k], from the output of the non-linear block, y[k], mitigates the non-linearity. Conceptually, as shown in FIG. 2B, adder 136 subtracts synthesized compensation function q(x), generated by q(x) function generator 134, from the DAC's non-linearity function p(x) accurately, shown as non-linearity function p(x) generator 132.

INL identification and compensation 140 also includes adaptive INL estimator 138 that uses adder 136 output $e_R[k]$ along with the input signal x[k] to estimate the error to control q(x) function generator 134 accordingly. INL function p(x) generator 132 represents the deviation from a linear output by a mixed-signal component, such as a DAC.

In practice, non-linearity function p(x) can vary significantly with supply and temperature variations. Therefore, techniques to describe the compensation function using factory trimming or on-power-up calibration may not be sufficient. For example, the temperature may change as the system heats up after the initial calibration. The goal here is to adaptively synthesize the non-linearity compensation function q(x) to cancel the effect of INL function p(x) accurately and robustly across Process, Supply, and Temperature (PVT) variations. To this end, the inventor's non-linearity identification and compensation scheme detects the residual error after compensation to adaptively construct the compensation function q(x). The complexity to build such adaptive non-linearity identification and compensation system can be reduced by how the inventor constructs the compensation function and how to adapt its coefficients.

This construction method can be aligned with the inventor's model to represent the non-linearity function, p(x).

Non-Linearity Representation

A continuous static non-linearity is typically represented in terms of an $N^{th}$ order power series given by:

$$y = p(x) = c_0 + c_1 x + \underbrace{c_2 x^2 + c_3 x^3 + \ldots + c_N x^N}_{\text{non-linearity terms}} = \sum_{i=0}^{\infty} c_i x^i \quad (1)$$

where $c_i$ represents the real valued polynomial coefficients. The $c_i$ coefficients can be estimated using cross-correlation techniques, which is prohibitively expensive in terms of hardware implementation, particularly as the polynomial order increases. In practice, the implementation of this kind of polynomial modeling and estimation technique is limited to a few (2 or 3) terms only.

Alternatively, the inventor represents any arbitrary unknown static non-linear function p(x) defined over a closed region $x \in [-x_p, +x_p]$ by a linear combination of a complete set of orthogonal basis functions or kernels $\phi_i(x)$:

$$p(x) = \sum_{i=1}^{\infty} c_i \phi_i(x) \quad (2)$$

where $c_i$ denotes the $i^{th}$ coefficient of the corresponding kernel. The orthogonal series method offers some interesting advantages over the power series method and allows a much simpler, but accurate, implementation of the compensation scheme as will be shown later. This is based on the underlying kernels' orthogonality properties. Kernels $\phi_i(x)$ are said to be orthogonal in the interval $-x_p \leq x \leq +x_p$ if they satisfy:

$$\int_{-x_p}^{x_p} \phi_i(x) \phi_j(x) dx = \begin{cases} 0 & \text{for } i \neq j \\ A & \text{for } i = j \end{cases} \quad (3)$$

where A is a constant. If range of x is a discrete set (i.e. M-levels quantized or digitally represented from $-M/2$ to $+M/2-1$), the complete set of orthogonal kernels consists of a finite number of M kernels:

$$p(x) = \sum_{i=1}^{M} c_i \phi_i(x) \quad (4)$$

$$\sum_{x=-M/2}^{M/2-1} \phi_i(x) \phi_j(x) = \begin{cases} 0 & \text{for } i \neq j \\ A & \text{for } i = j \end{cases} \quad (5)$$

For the rest of the disclosure, the inventor treats x as a discrete-time signal with discrete-amplitude (M values). Without loss of generality, all the upcoming equations and analysis are valid and easily applied when x has continuous amplitude ($M \to \infty$).

The compensation function q(x) is similarly represented by the orthogonal kernels. In practice, only a limited number of ($N \leq M$)-kernels can be used in implementation of q(x):

$$q(x) = \sum_{i=1}^{N} \hat{c}_i \phi_i(x) \quad (6)$$

where $\hat{c}_i$ denotes the $i^{th}$ compensation coefficient of the corresponding kernel.

Optimum Compensation Coefficients

The difference $e_R(x) = p(x) - q(x)$, represents the residual compensation error due to the incomplete representation, which is minimum in the least square sense $$\lim_{N \to M} MSE = 0,$$

where MSE is the residual mean square error after compensation. It is defined as:

$$MSE \triangleq \frac{1}{M} \sum_{x=-M/2}^{M/2-1} \left[ p(x) - \sum_{i=1}^{N} \hat{c}_i \phi_i(x) \right]^2 \quad (7)$$

The $\hat{c}_i$ coefficients are chosen adaptively in the background to track changes in the non-linearity function, p(x), across PVT variations. The following analysis is presented to show what the optimum coefficient values that minimize MSE are assuming the input signal, x[k], has a uniform distribution with amplitude values from $-M/2$ to $+M/2-1$. This assumption is in-line with the type of signals the inventor encounters in $\Delta\Sigma$ QNC schemes. The real-time error signal can be expressed as:

$$e_R[k] = y[k] - \hat{y}[k] \quad (8)$$

Let $\{k_1, k_2, \ldots, k_L\}$ represents L different discrete-time instances. Then, the inventor can use vector notation to describe input, output, compensation, and error signals as $1 \times L$ vectors as follows:

$$X = [x[k_1], x[k_2], \ldots, x[k_L]]^T \quad (9)$$

$$Y = [y[k_1], y[k_2], \ldots, y[k_L]]^T \quad (10)$$

$$\hat{Y} = [\hat{y}[k_1], \hat{y}[k_2], \ldots, \hat{y}[k_L]]^T \quad (11)$$

$$E_R = [e_R[k_1], e_R[k_2], \ldots, e_R[k_L]]^T \quad (12)$$

where T is the transpose operator. Similarly, the inventor can describe coefficients, $\hat{c}_i$, as $1 \times N$ vector, and the orthogonal kernels as $N \times L$ matrix:

$$\hat{C} = [\hat{c}_1, \hat{c}_2, \ldots, \hat{c}_N]^T \quad (13)$$

$$\Phi = \begin{bmatrix} \phi_1(x[k_1]), & \phi_2(x[k_1]), & \ldots & \phi_N(x[k_1]) \\ \phi_1(x[k_2]), & \phi_2(x[k_2]), & \ldots & \phi_N(x[k_2]) \\ \ldots & \ldots & \ldots & \ldots \\ \phi_1(x[k_L]), & \phi_2(x[k_L]), & \ldots, & \phi_N(x[k_L]) \end{bmatrix} \quad (14)$$

$$\Phi = [\Phi_1(X), \Phi_2(X), \ldots, \Phi_N(X)]$$

Then, compensation and error vectors can be expressed as:

$$\hat{Y} = \Phi \hat{C} \quad (15)$$

$$E_R = Y - \hat{Y} = Y - \Phi \hat{C} \quad (16)$$

The inventor defines the cost function, $\varepsilon$, to be minimized as:

$$\varepsilon = E_R^T E_R \quad (17)$$

Then, by setting the derivative of E with respect to $\hat{C}$, $\nabla_{\hat{C}} \xi$, to zero, $\varepsilon$ can be minimized at $\hat{C}$ optimal as follows:

$$\nabla_{\hat{C}} \xi = (-\Phi^T) \cdot 2(Y - \Phi \hat{C}) = 0 \quad (18)$$

$$\hat{C} = (\Phi^T \Phi)^{-1} \Phi^T Y \quad (19)$$

The inventor can clearly see the error minimization process depends mainly on the autocorrelation matrix product $\Phi^T \Phi$. For a uniformly distributed input vector, X, and because of the kernel's orthogonality (see eq. (5)), the autocorrelation matrix product $\Phi^T\Phi$ can be reduced to an identity matrix, I, times a constant, A:

$$\Phi^T\Phi = \begin{bmatrix} \Phi_1(X)^T \cdot \Phi_1(X), & \Phi_1(X)^T \cdot \Phi_2(X), & \ldots & \Phi_1(X)^T \cdot \Phi_N(X), \\ \Phi_2(X)^T \cdot \Phi_1(X), & \Phi_2(X)^T \cdot \Phi_2(X), & \ldots & \Phi_2(X)^T \cdot \Phi_N(X), \\ \ldots & \ldots & \ldots & \ldots \\ \Phi_N(X)^T \cdot \Phi_1(X), & \Phi_N(X)^T \cdot \Phi_2(X), & \ldots & \Phi_N(X)^T \cdot \Phi_N(X), \end{bmatrix} = AI \quad (20)$$

Then, $\hat{C}$ optimal can be expressed as:

$$\hat{C} = \frac{1}{A}\Phi^T Y \quad (21)$$

In standard format, the optimum compensation coefficients, $\hat{c}_i$, to minimize MSE:

$$\hat{c}_i = \frac{1}{A}\sum_{k=k_1}^{k_L} y[k] \cdot \phi_i(x[k]) \quad (22)$$

In other words, optimum compensation coefficients, $\hat{c}_i$, represent the projection of the non-linearity function, p(x), onto the orthogonal kernels, $\phi_i(x)$:

$$\hat{c}_i = \frac{1}{A}\sum_{x=-M/2}^{M/2-1} p(x) \cdot \phi_i(x) \quad (23)$$

Adaptive Non-Linearity Compensation Using LMS Technique

Orthogonality helps to avoid the prohibitively expensive matrix inversion operation $(\Phi^T\Phi)^{-1}$ of eq. (19). But still in practice finding the optimum compensation coefficients in a background manner by computing $\Phi^T Y$ is not obvious, as the inventor may not have signal y[k] readily available in a digital format. Alternatively, the inventor can use the residual error signal after compensation, $e_R[k]$, to adaptively construct the compensation function q(x). It may be better to search for the optimal solution iteratively using steepest-descent methods. Starting from an initial guess, $\hat{C}^{(0)}$, and using the slope of the cost function, the inventor can improve upon it in a recursive manner until it ultimately converges to the optimal $\hat{C}$ using eq. (18) as follows:

$$\hat{C}^{(j)} = \hat{C}^{(j-1)} - \mu \cdot \nabla_{\hat{C}}\xi, \quad j \geq 1 \quad (24)$$

$$\hat{C}^{(j)} = \hat{C}^{(j-1)} + \mu \cdot (\Phi^T E_R), \quad j \geq 1$$

where $\mu$ is the step size parameter. The error signal of eq. (5) can be expressed using kernels as:

$$e_R[k] = y[k] - \hat{y}[k] = \sum_{i=1}^{N}(c_i - \hat{c}_i)\phi_i(x[k]) + \underbrace{\sum_{i=N+1}^{M} c_i\phi_i(x[k])}_{e_M[k]} \quad (25)$$

The second error term is due to incomplete kernel representation (i.e. N<M). Because of kernels orthogonality (see eq. (5)), the nonorthogonal terms will average out and the expectation $\Phi^T E_R$, can approximately be reduced to:

$$\Phi^T E_R = \begin{bmatrix} \sum_{k=k_1}^{k_L} \phi_1(x[k]) \cdot e_R[k] \\ \vdots \\ \sum_{k=k_1}^{k_L} \phi_N(x[k]) \cdot e_R[k] \end{bmatrix} \quad (26)$$

$$\Phi^T E_R = \begin{bmatrix} \sum_{k=k_1}^{k_L} \phi_1(x[k]) \cdot \left(\sum_{i=1}^{N}(c_i - \hat{c}_i)\phi_i(x[k]) + e_M[k]\right) \\ \vdots \\ \sum_{k=k_1}^{k_L} \phi_N(x[k]) \cdot \left(\sum_{i=1}^{N}(c_i - \hat{c}_i)\phi_i(x[k]) + e_M[k]\right) \end{bmatrix}$$

$$\Phi^T E_R \approx A \begin{bmatrix} (c_1 - \hat{c}_1) \\ \vdots \\ (c_N - \hat{c}_N) \end{bmatrix}$$

This clearly shows that the iterative process will continue until the compensation coefficients, $\hat{c}_i$, converge to the non-linearity coefficients, $c_i$, representing p(x) of eq. (4). For simplicity, the instantaneous approximation of variables $x_i[k]=\phi_i(x[k])$ and $e_R[k]$ are used to form a Least Mean Square (LMS) algorithm. The LMS adaptive technique was chosen because of its low computational complexity. The coefficients update equation of (24) can be re-written as:

$$\hat{c}_i[k+1]=\hat{c}_i[k]+\mu x_i[k]e_R[k] \quad (27)$$

LMS is effective when both $e_R[k]$ and $x_i[k]$ are zero-mean signals (i.e. has no DC components).

Figure 3:
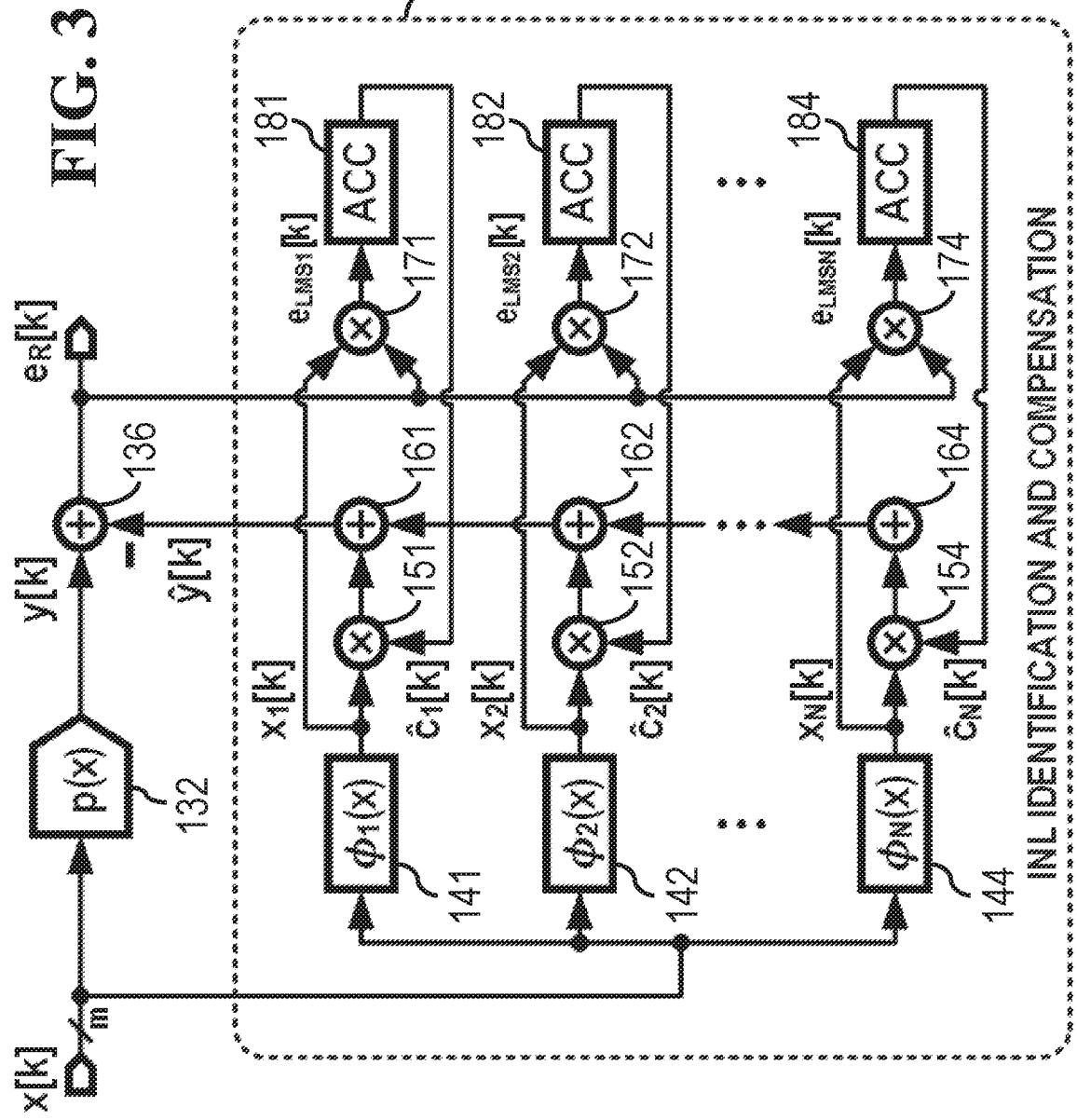
FIG. 3 shows a block diagram of the adaptive INL identification and compensation scheme using the LMS method.

FIG. 3 shows a block diagram of the adaptive INL identification and compensation scheme using the LMS method. Assume that function p(x) generator 132 represents the non-linear error generated by an m-bit DAC, and the range of x is a discrete set with $M=2^m$ levels. The cancellation signal $\hat{y}[k]$ generated by INL identification and compensation 140 is subtracted from the error output by function p(x) generator 132 using adder 136 to generate a residual error $e_R[k]$.

INL identification and compensation 140 has N paths. The first path for N=1 has kernel block 141 that generates $x_1[k]$, which is multiplied by the residual error $e_R[k]$ using multiplier 171 and accumulated in accumulator 181. The accumulated output, $\hat{c}_1[k]$, is multiplied using multiplier 151 with kernel block 141's output, $x_1[k]$, and then summed with products from other kernel blocks 142, . . . 144 by summers 161, 162, . . . 164 to generate cancellation signal $\hat{y}[k]$.

The input signal x[k] is passed though N kernel blocks 141, 142, . . . 144 to generate $x_i[k]=\phi_i(x[k])$ signals, which are then scaled using multipliers 151, 152, . . . 154 with the corresponding coefficients and aggregated to synthesize the cancellation signal ŷ[k]. Accumulators 181, 182, . . . 184 received scaled inputs from multipliers 171, 172, . . . 174 to generate the corresponding coefficients $\hat{c}_1[k]$, $\hat{c}_2[k]$, . . . $\hat{c}_N[k]$.

Choice of Orthogonal Kernels

Conceptually, any complete orthogonal kernels set can be used to represent p(x) and construct q(x). In practice, a finite number of N kernels is used. The choice of the kernel set can have a determinate impact on the compensation MSE. Increasing N equivalently causes finer granularity in the input signal, x, to the kernels. The proper choice of the kernel set is very important to practically realize the compensation function in an efficient manner, while ensuring a small MSE that meets the target specifications.

For example, the most famous orthogonal representation, Fourier series, uses sine and cosine kernels. In practice, the implementation of sine and cosine kernels can lead to prohibitively complex implementation and can result in a very large MSE when N<<M. Other non-sinusoidal representations can be categorized as polynomial kernels and piece-wise kernels. Classical orthogonal polynomial kernels such as Laguerre polynomials, Hermite polynomials, and Jacobi polynomials (including Legendre, Chebyshev, Gegenbauer polynomials) are difficult to implement in practice, because of the numerous multiply and accumulate operations involved.

Figure 4:
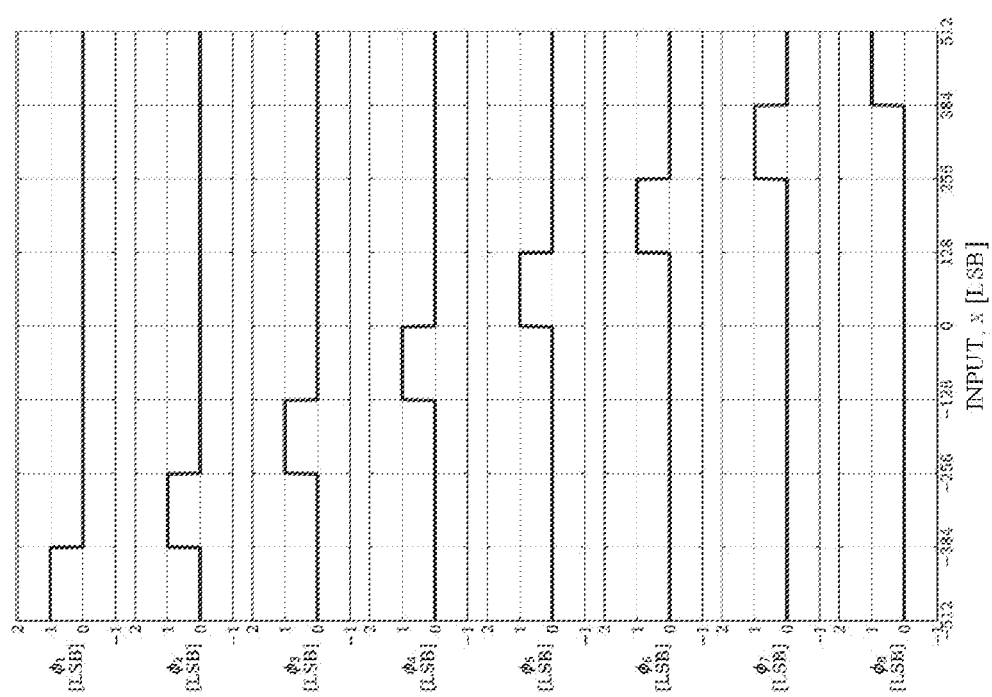
FIG. 4 is a graph of a Block-Pulse set of kernels.

On the other hand, piece-wise kernels can offer a much simpler implementation. The simplest piece-wise kernels set is based on block pulse functions. A Block Pulse (BP) N-kernels set can be defined using:

$$\phi_i(x) = \begin{cases} 1, & \text{for } M\left(-\frac{1}{2} + \frac{i-1}{N}\right) \leq x < M\left(-\frac{1}{2} + \frac{i}{N}\right) \\ 0, & \text{elsewhere} \end{cases} \quad (28)$$

where i=1, 2, . . . , N. FIG. 4 is a graph of a Block-Pulse set of kernels. In the example of FIG. 4, N=8 for the BP orthogonal kernels set. There is a sequence of 8 non-overlapping pulses for a range of input x between −512 and +512, labeled $\phi_1[\text{LSB}]$ to $\phi_8[\text{LSB}]$.

Figure 5:
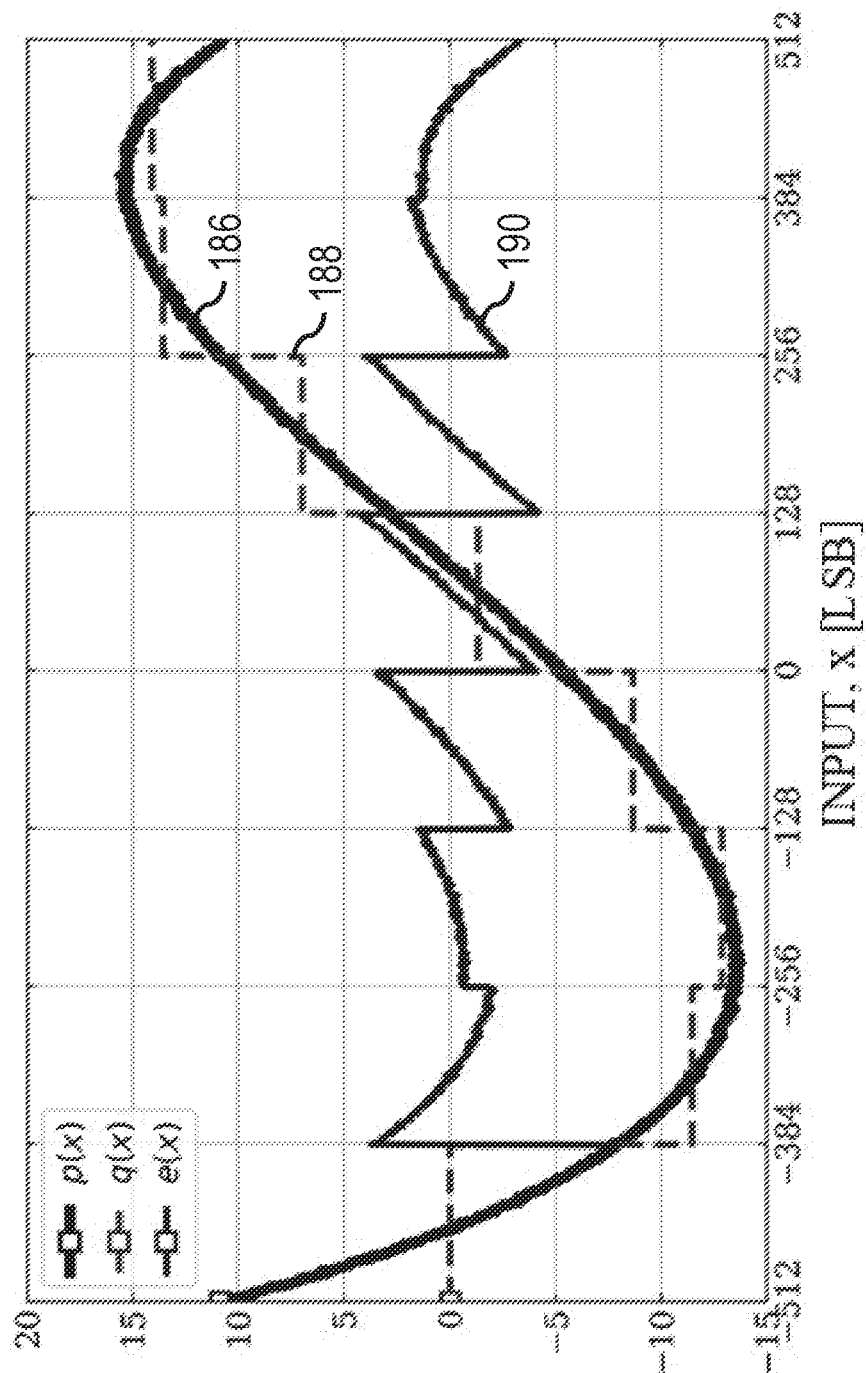
FIG. 5 shows simulation results of an LMS embodiment of the non-linearity identification and compensation circuit.

In the discrete-sense, BP kernels can be represented by the identity matrix I. FIG. 5 shows simulation results of an LMS embodiment of the non-linearity identification and compensation circuit. This simulation is for a 10-bit DAC with fifth-order INL characteristics p(x) with a 0.1 LSB random standard deviation using the BP kernels set in FIG. 4. The difference e (x)=p(x)−q(x) represents the residual error due to the limited number of kernels (N=8<<M=1024) used in constructing q(x). It can clearly be seen how q(x), curve 188, is constructed from distinct segments, each representing a block pulse. The compensation coefficients represent the weight assigned to each block pulse to minimize MSE, which is the mean of this corresponding segment of p(x) along curve 186. Curve 190 shows that error e(x) varies from about +4 to −7, except for an initial excursion to +10 near −512. The Root Mean Square (RMS) of this error e(x), in steady-state, is about 2.50 LSB.

Figure 6:
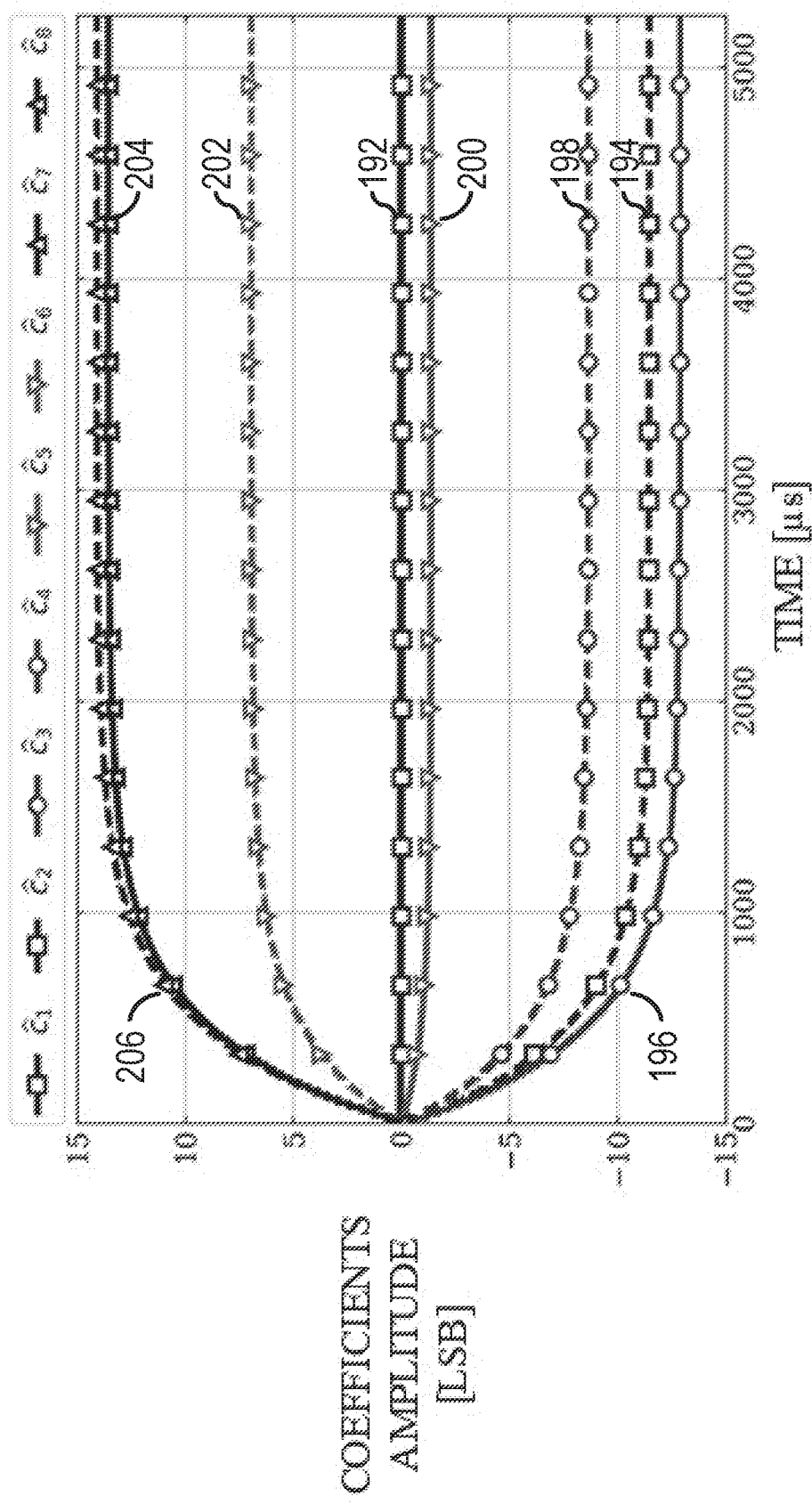
FIG. 6 is a graph demonstrating the simulated settling behavior of the compensation coefficients for the LMS embodiment of FIGS. 4-5.

FIG. 6 is a graph demonstrating the simulated settling behavior of the compensation coefficients for the LMS embodiment of FIGS. 4-5. There are N=8 kernels generating the 8 block pulses of FIG. 4 and the error function e(x) of FIG. 5. Curves 192, 194, 196, 198, 200, 202, 204, 206 show optimum compensation coefficients, $\hat{c}_1$, $\hat{c}_2$, $\hat{c}_3$, $\hat{c}_4$, $\hat{c}_5$, $\hat{c}_6$, $\hat{c}_7$, $\hat{c}_8$, respectively. After a settling time of about 1500 microseconds, the coefficients remain relatively constant.

The reduced complexity of BP kernels permits increasing the number of kernels up to N=16 or N=32 in practice. Using N=16, the RMS error can be reduced to 1.29 LSB. But BP kernels suffer from a major drawback. The LMS adaptation of BP kernels can be sensitive to any offset or flicker noise added to the $e_R[k]$ signal. This is because all BP kernels, and accordingly generated $x_i[k]$ signals, have a DC component, and LMS is effective when both $e_R[k]$ and $x_i[k]$ are zero-mean signals (i.e. has no DC components) (see eq. (27)). To overcome this limitation, constant piece-wise kernels using Haar functions can be used, where only one kernel accounts for the DC component. Haar functions have three possible states 0 and ±a, where a is set to normalize each kernel's amplitude to satisfy eq. (5).

Figure 7:
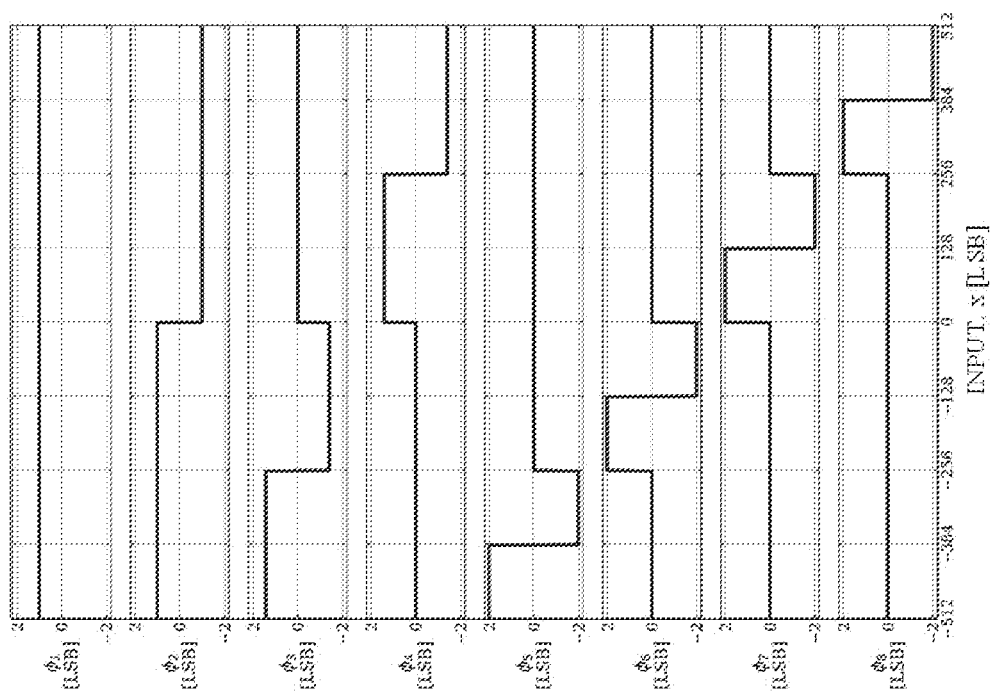
FIG. 7 is a graph showing an example of Haar kernels.

FIG. 7 is a graph showing an example of Haar kernels. This orthogonal Haar kernels set has N=8 kernels labeled $\phi_1[\text{LSB}]$ to $\phi_8[\text{LSB}]$ for a range of input x between −512 and +512. The first kernel $\phi_1[\text{LSB}]$ sets the DC component while the other 7 kernels have both high +a, and low −a, segments. The last 6 kernels have high, low, and zero-value 0 segments, and all 7 kernels $\phi_2[\text{LSB}]$ to $\phi_8[\text{LSB}]$ average to zero over the full range.

Walsh functions can also be leveraged to build the constant piece-wise kernel set, where only one kernel accounts for the DC component. Walsh functions uses only two possible states ±1 to form a complete orthonormal set. It has striking similarity with the sine-cosine functions, primarily with respect to their zero-crossing patterns. In the discrete-sense, Walsh kernels are represented by N×N matrix of Walsh Hadamard (WH) codes. In general, the WH matrix $WH(n_0)$ can be generated using the following recurrence relation:

$$WH(n) = \begin{bmatrix} +WH(n-1) & +WH(n-1) \\ +WH(n-1) & -WH(n-1) \end{bmatrix} \quad (29)$$

where WH(O)=1 and $n=\log_2 N$.

Figure 8:
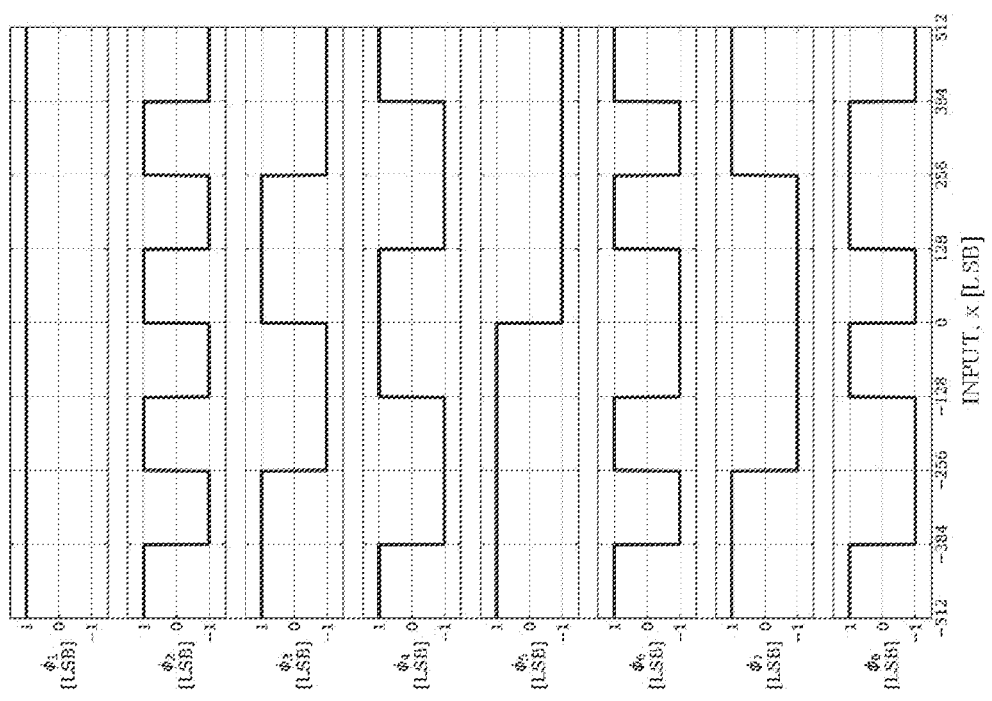
FIG. 8 shows an example of a Walsh Hadamard (WH) kernels set.

FIG. 8 shows an example of a Walsh Hadamard (WH) kernels set. This orthogonal set of kernels is arranged in natural order and has N=8. The set is composed of N/2 even kernels ($\phi_1[\text{LSB}]$, $\phi_4[\text{LSB}]$, $\phi_6[\text{LSB}]$, and $\phi_7[\text{LSB}]$) and N/2 odd kernels (kernels $\phi_2[\text{LSB}]$, $\phi_3[\text{LSB}]$, $\phi_5[\text{LSB}]$, and $\phi_8[\text{LSB}]$). The DC component is set by the first kernel $\phi_1[\text{LSB}]$. This even-odd feature can be leveraged to represent and accordingly compensate for non-linearity using odd kernels only in differential systems where even order distortion and non-linearity is inherently suppressed.

Figure 9:
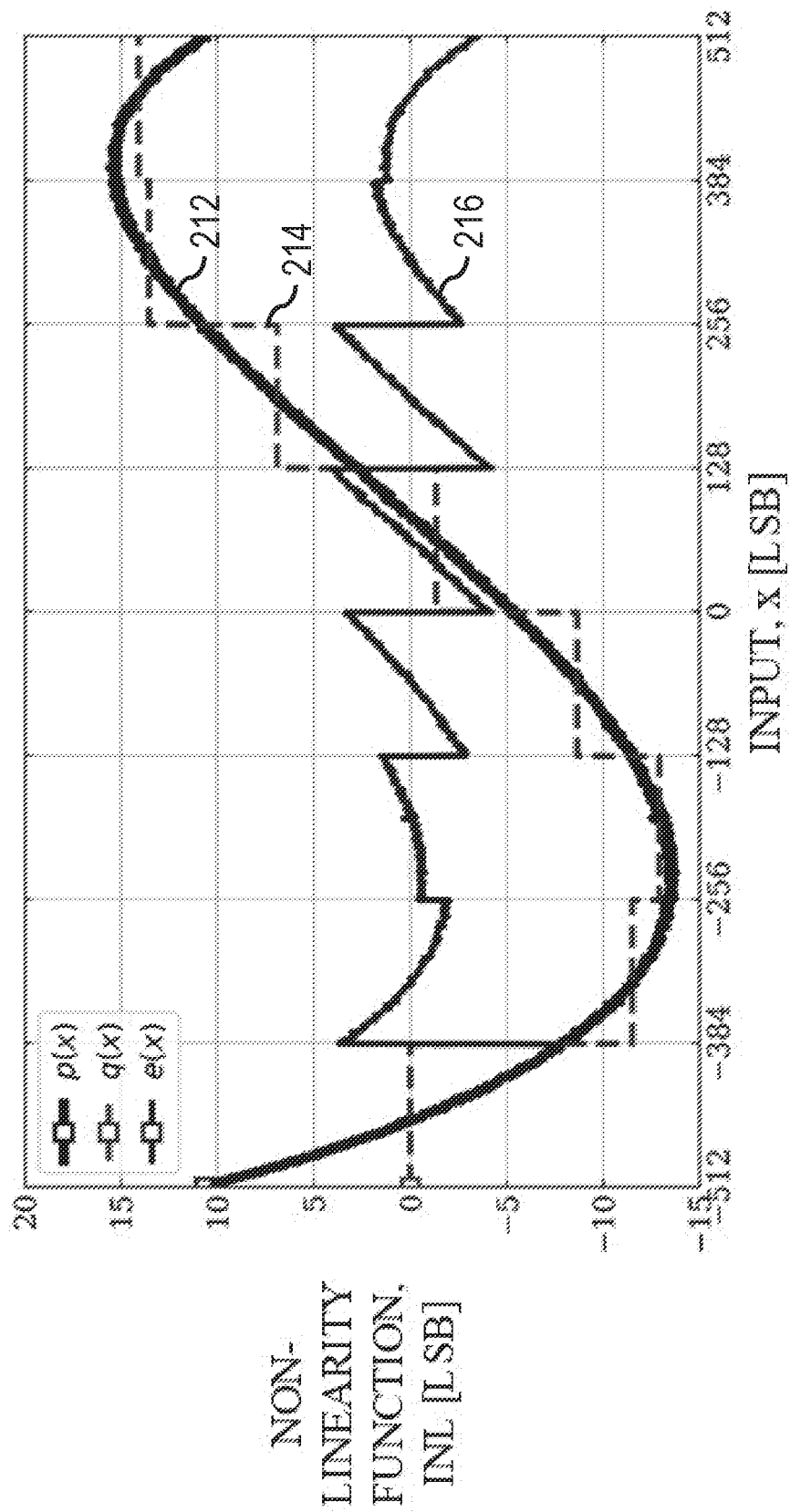
FIG. 9 shows simulation results of the LMS adaptation of the non-linearity identification and compensation using a Walsh Hadamard (WH) kernels set.

FIG. 9 shows simulation results of the LMS adaptation of the non-linearity identification and compensation using a Walsh Hadamard (WH) kernels set. This simulation is for a 10-bit DAC with fifth-order INL characteristics p(x) with a 0.1 LSB random standard deviation using the WH kernels set of FIG. 8. The difference between e(x)=p(x)−q(x) represents the residual error due to the limited number of kernels (N=8<<M=1024) used in constructing q(x). In this case, q(x), curve 214, is constructed by the weighted summation of different kernels simulating a segment of p(x) along curve 212.

Curve 216 shows that error e(x) varies from about +4 to −7, except for an initial excursion to +10 near −512. The Root Mean Square (RMS) of this error e(x), in steady-state, is about 2.50 LSB.

Figure 10:
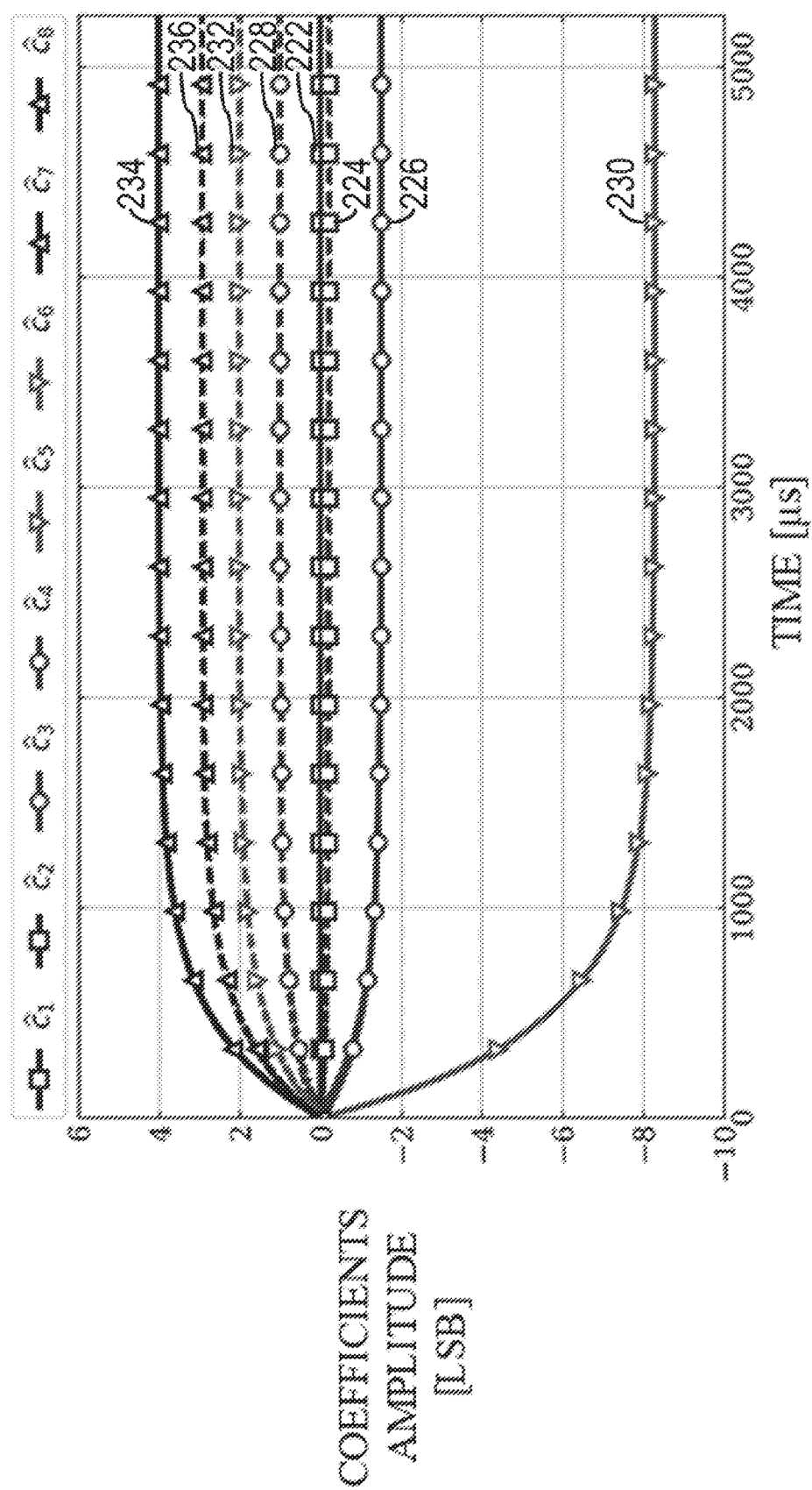
FIG. 10 is a graph demonstrating the simulated settling behavior of the compensation coefficients for the LMS embodiment of FIGS. 8-9 with the Walsh Hadamard (WH) kernels set.

FIG. 10 is a graph demonstrating the simulated settling behavior of the compensation coefficients for the LMS embodiment of FIGS. 8-9 with the Walsh Hadamard (WH) kernels set. There are N=8 kernels generating the 8 block pulses of FIG. 8 and the error function e(x) of FIG. 9. Curves 222, 224, 226, 228, 230, 232, 234, 236 show optimum compensation coefficients, $\hat{c}_1$, $\hat{c}_2$, $\hat{c}_3$, $\hat{c}_4$, $\hat{c}_5$, $\hat{c}_6$, $\hat{c}_7$, $\hat{c}_8$, respectively. After a settling time of about 1500 microseconds, the coefficients remain relatively constant.

Similar to BP kernels, the reduced complexity of WH kernels permits increasing the number of kernels to N=16 or N=32 in practice. Using N=16, the RMS error can be reduced to 1.29 LSB. However, still the residual error is large and may not meet the target compensation accuracy.

Triangular Piece-Wise Kernels

To improve compensation, the inventor modifies WH kernels to be a linear piece-wise kernels set that uses triangular waveforms in contrast to the rectangular waveforms of the WH kernels. The inventor refers to the new set as Triangular Walsh Hadamard (TWH).

Compared to prior-art piece-wise linear approaches, which used a Simplicial Canonical Piece-Wise Linear (SCPWL) function, the proposed TWH representation offers more accurate and simpler representation. In contrast to constant-piece-wise of the aforementioned kernels, the proposed THW linear piece-wise representation considerably improves the compensation accuracy, because now each segment can be represented by a linear function, and as a result the RMS error can be reduced considerably. TWH kernels offer very simple implementation of sine/cosine like kernels.

Figure 11:
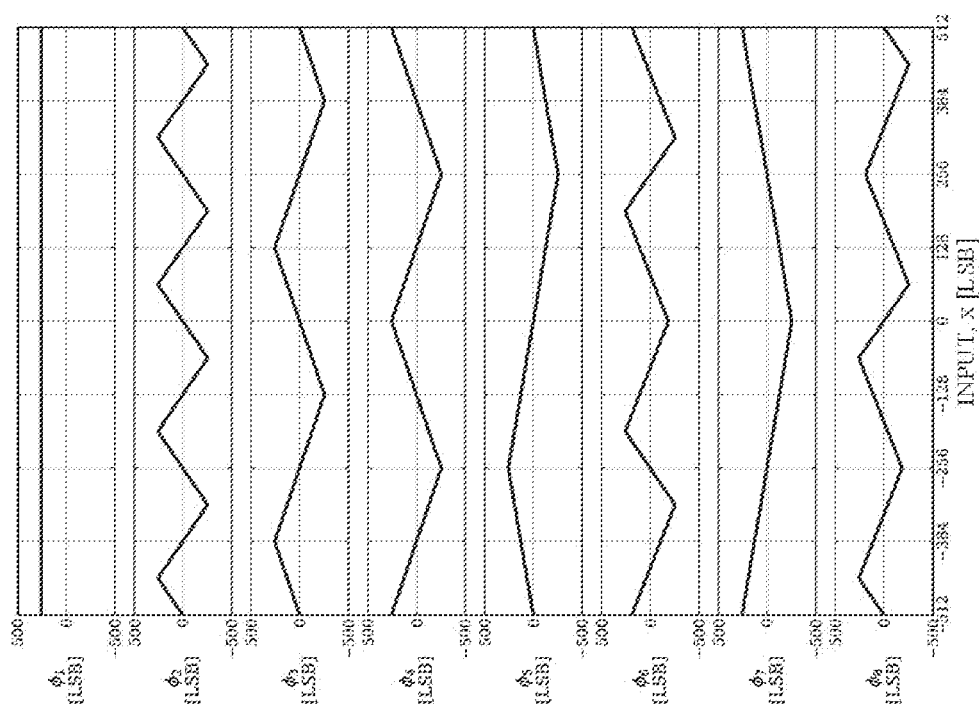
FIG. 11 shows an example of a Triangular Walsh Hadamard (TWH) kernels set.

FIG. 11 shows an example of a Triangular Walsh Hadamard (TWH) kernels set. This orthogonal set of kernels is arranged in natural order and has N=8. The set is composed of N/2 even kernels ($\phi_1$[LSB], $\phi_4$[LSB], $\phi_6$[LSB], and $\phi_7$[LSB]) and N/2 odd kernels (kernels $\phi_2$[LSB], $\phi_3$[LSB], $\phi_5$[LSB], and $\phi_8$[LSB]). The DC component is set by the first kernel $\phi_1$[LSB]. This even-odd feature can be leveraged to represent and accordingly compensate for non-linearity using odd kernels only in differential systems where even order distortion and non-linearity is inherently suppressed.

Figure 12:
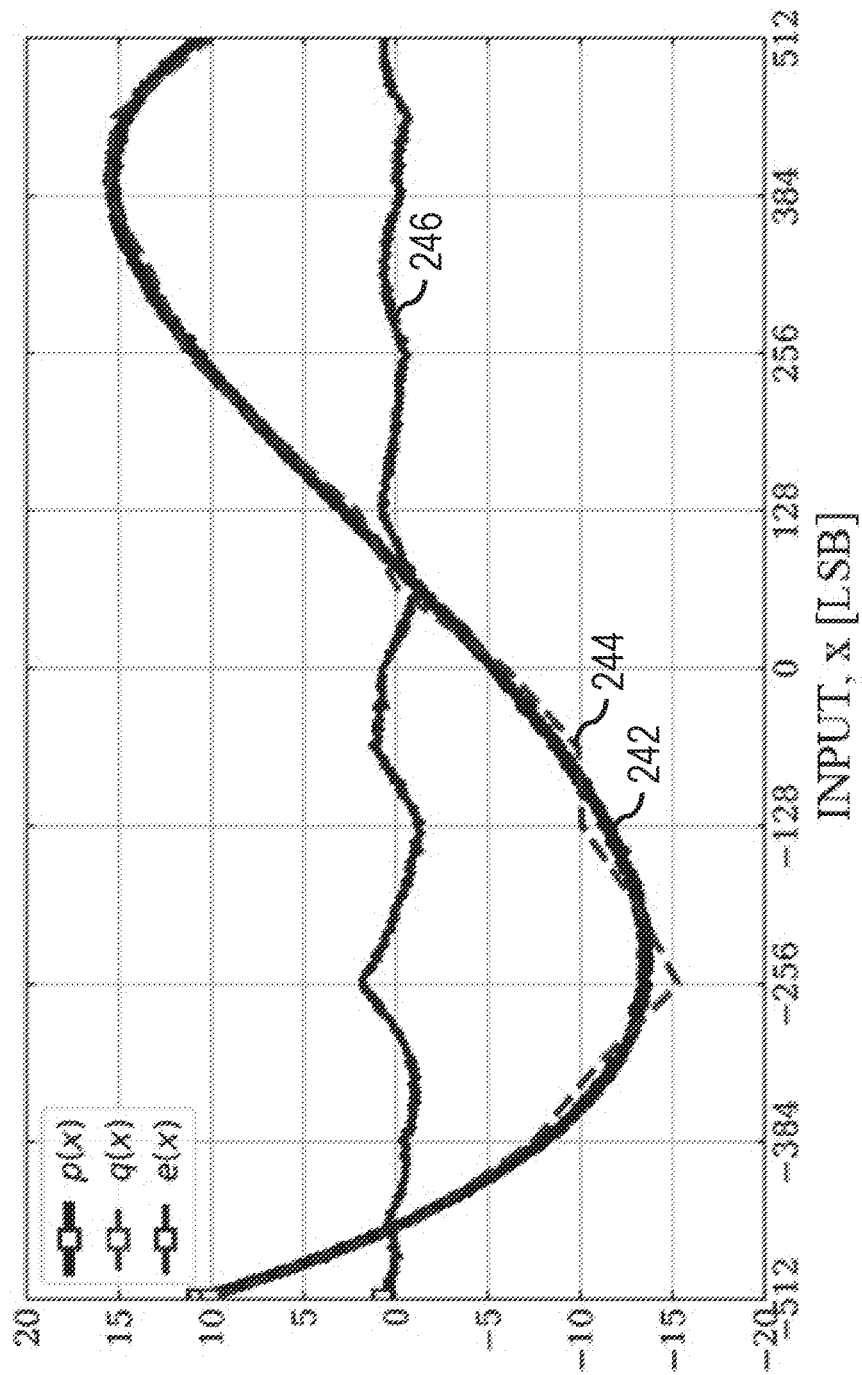
FIG. 12 shows simulation results of the LMS adaptation of the non-linearity identification and compensation using a Triangular Walsh Hadamard (TWH) kernels set.

FIG. 12 shows simulation results of the LMS adaptation of the non-linearity identification and compensation using a Triangular Walsh Hadamard (TWH) kernels set. This simulation is for a 10-bit DAC with fifth-order INL characteristics p(x) with a 0.1 LSB random standard deviation using the Triangular Walsh Hadamard (TWH) kernels set of FIG. 11. The difference between e(x)=p(x)−q(x) represents the residual error due to the limited number of kernels (N=8<<M=1024) used in constructing q(x). In this case, q(x), curve 244, is constructed by the weighted summation of different kernels simulating a segment of p(x) along curve 242.

Curve 246 shows that error e(x) varies from about +2 to −2, and there is no longer an initial excursion to a high value near −512, as was seen in FIGS. 5, 9 with other kernels. The Root Mean Square (RMS) of this error e(x), in steady-state, is about 0.65 LSB. Using TWH results in a more than 4× improvement compared to WH, for N=8. Curve 246 is much flatter, showing a much lower error, than error curve 190 of FIG. 5 and curve 216 of FIG. 9. Error is dramatically reduced using the inventor's TWH kernels compared with WH and BP kernels.

Figure 13:
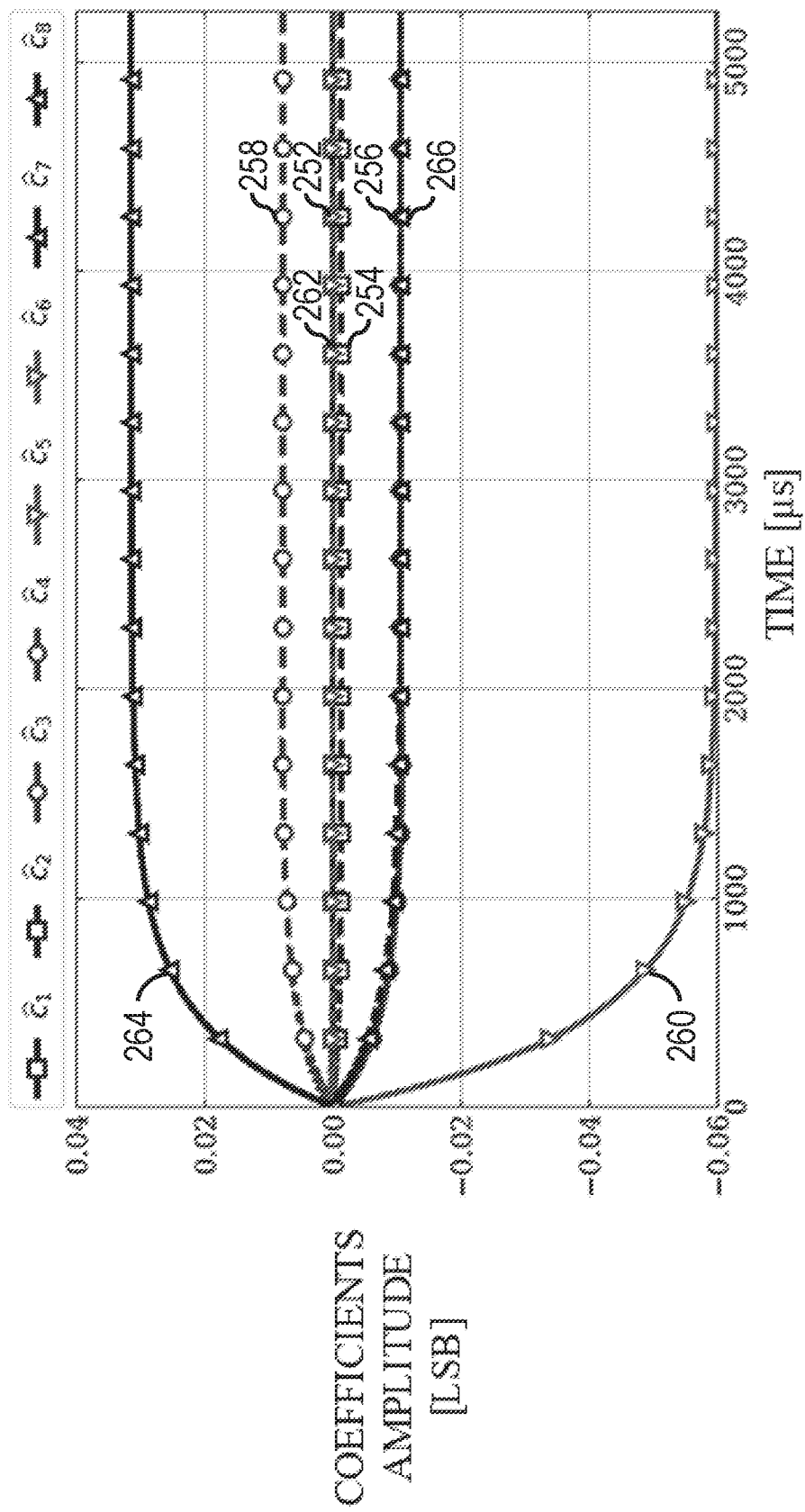
FIG. 13 is a graph demonstrating the simulated settling behavior of the compensation coefficients for the LMS embodiment of FIGS. 11-12 with the Triangular Walsh Hadamard (TWH) kernels set.

FIG. 13 is a graph demonstrating the simulated settling behavior of the compensation coefficients for the LMS embodiment of FIGS. 11-12 with the Triangular Walsh Hadamard (TWH) kernels set. There are N=8 kernels generating the 8 block pulses of FIG. 11 and the error function e(x) of FIG. 12. Curves 252, 254, 256, 258, 260, 262, 264, 266 show optimum compensation coefficients, $\hat{c}_1$, $\hat{c}_2$, $\hat{c}_3$, $\hat{c}_4$, $\hat{c}_5$, $\hat{c}_6$, $\hat{c}_7$, $\hat{c}_8$, respectively. After a settling time of about 1500 microseconds, the coefficients remain relatively constant.

Constant Piece-Wise Kernels with Interpolation

The inventor's linear piece-wise kernels, Triangular Walsh Hadamard (TWH), considerably reduce the compensation MSE compared to piece-wise kernels such as BP and WH. However, TWH kernels have a scalability issue, because as the number of kernels increases, the implementation complexity of TWH kernels grows rapidly with numerous accumulate and multiply operations. So practically, it may not be efficient to increase the number of THW kernels beyond N=8. To break this trade-off between compensation accuracy and implementation complexity, the inventor leverages the remarkably simple constant piece-wise kernels as BP, Harr, or WH, in addition to linear interpolation to achieve the same compensation accuracy as TWH but with a much simpler and scalable implementation.

Figure 14:
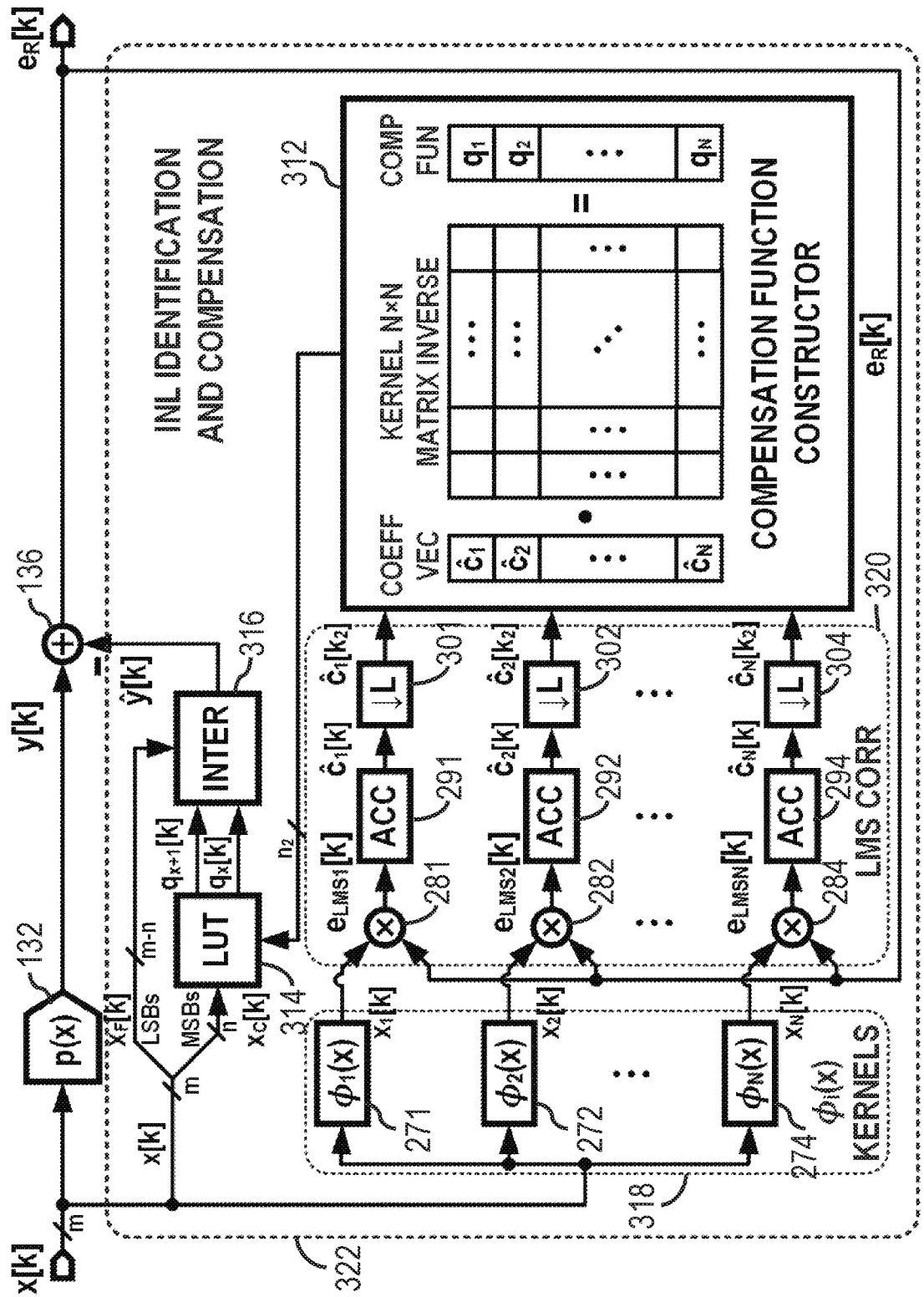
FIG. 14 is a block diagram of adaptive INL identification and compensation using LMS correlation and constant-piece kernels with interpolation.

FIG. 14 is a block diagram of adaptive INL identification and compensation using LMS correlation and interpolation with constant-piece kernels. Instead of generating the compensation signal, $\hat{y}[k]$, by directly passing the input signal, x[k], to the kernels, in this embodiment, the compensation function $q_{LUT}(x)$ is constructed using compensation function constructor 312 and saved in a memory or look-up table (LUT) 314. Input x[k] is split into coarse (MSB) signals, $x_C[k]=\lfloor x[k] \times 2^{-(m-n)} \rfloor$, and fine (LSB) signals, $x_F[k]=x[k]-x_C[k] \times 2^{(m-n)}$, where $\lfloor \cdot \rfloor$ is the floor operator. The Most Significant Bits (MSBs) $x_C[k]$ has an n-bit width and is used as the address of LUT 314 to find the LUT entry for the corresponding $q_x[k]=q_{LUT}(x_C[k])$ and $q_{x+1}[k]=q_{LUT}(x_C[k]+1)$ outputs. The compensation signal, $\hat{y}[k]$, is generated by interpolator 316 which interpolates between $q_x[k]$ and $q_{x+1}[k]$ as follows:

$$\hat{y}[k]=q_x[k]+(q_{x+1}[k]-q_x[k]) \times x_F[k] \times 2^{-(m-n)} \quad (30)$$

The interpolation process smoothes the final compensation function, q(x). Compensation function constructor 312 can use inverse matrix and dot product operations to directly construct $q_{LUT}(x)$ and update LUT 314 routinely to track PVT variations. Because PVT tracking is a slow process, inverse matrix computation and LUT update can be done at much slower rates than the input sample rate by adding decimation filters 301, 302, . . . 304 on the outputs of accumulators 291, 292, . . . 294 in LMS correlator 320.

For BP kernels, the kernel matrix is an identity matrix, which means its inverse is also an identity matrix, therefore coefficients can directly represent $q_{LUT}(x)$. For WH kernels, fast inverse WH transform (iWHT) can be used to construct $q_{LUT}(x)$ from coefficients, $\hat{c}_i$, in an efficient manner compared to direct inverse matrix and dot product operations. Compensation function constructor 312 using iWHT receives the outputs of decimation filters 301, 302, . . . 304 and generates updates to LUT 314. The fast iWHT algorithm is similar to the well-known inverse fast Fourier transform (iFFT). The fast iWHT is considerably more efficient and faster to compute than iFFT, because it only uses ±1 states in its kernel representation, so each operation can involve only addition and subtraction compared to complex and costly multiplication operations used in the iFFT computation.

Assume that function p(x) generator 132 represents the non-linear error generated by an m-bit DAC, and the range of x is a discrete set with $M=2^m$ levels. The cancellation signal $\hat{y}[k]$ generated by INL identification and compensation 322 is subtracted from the error output by function p(x) generator 132 using adder 136 to generate a residual error $e_R[k]$.

INL identification and compensation 322 has N paths. The first path for N=1 has kernel block 271 that generates $x_1[k]$, which is multiplied by the residual error $e_R[k]$ using multiplier 281. The multiplier output, $e_{LMS1}[k]$, is accumulated by accumulator 291 and decimated by decimation filter 301 to generate the first input to compensation function constructor 312, $\hat{c}_1[k_2]$.

The input signal x[k] is passed though N kernel blocks 271, 272, . . . 274 in kernels 318 to generate $x_i[k]=\phi_i(x[k])$ kernel signals, which are then multiplied with the residual error $e_R[k]$ using multipliers 281, 282, . . . 284 and accumulated by accumulators 291, 292, . . . 294 and decimated by decimation filters 301, 302, . . . 304 and input to compensation function constructor 312. LUT 314 is updated by compensation function constructor 312, making PVT adjustments for LUT interpolation to synthesize the cancellation signal $\hat{y}[k]$.

Figure 15:
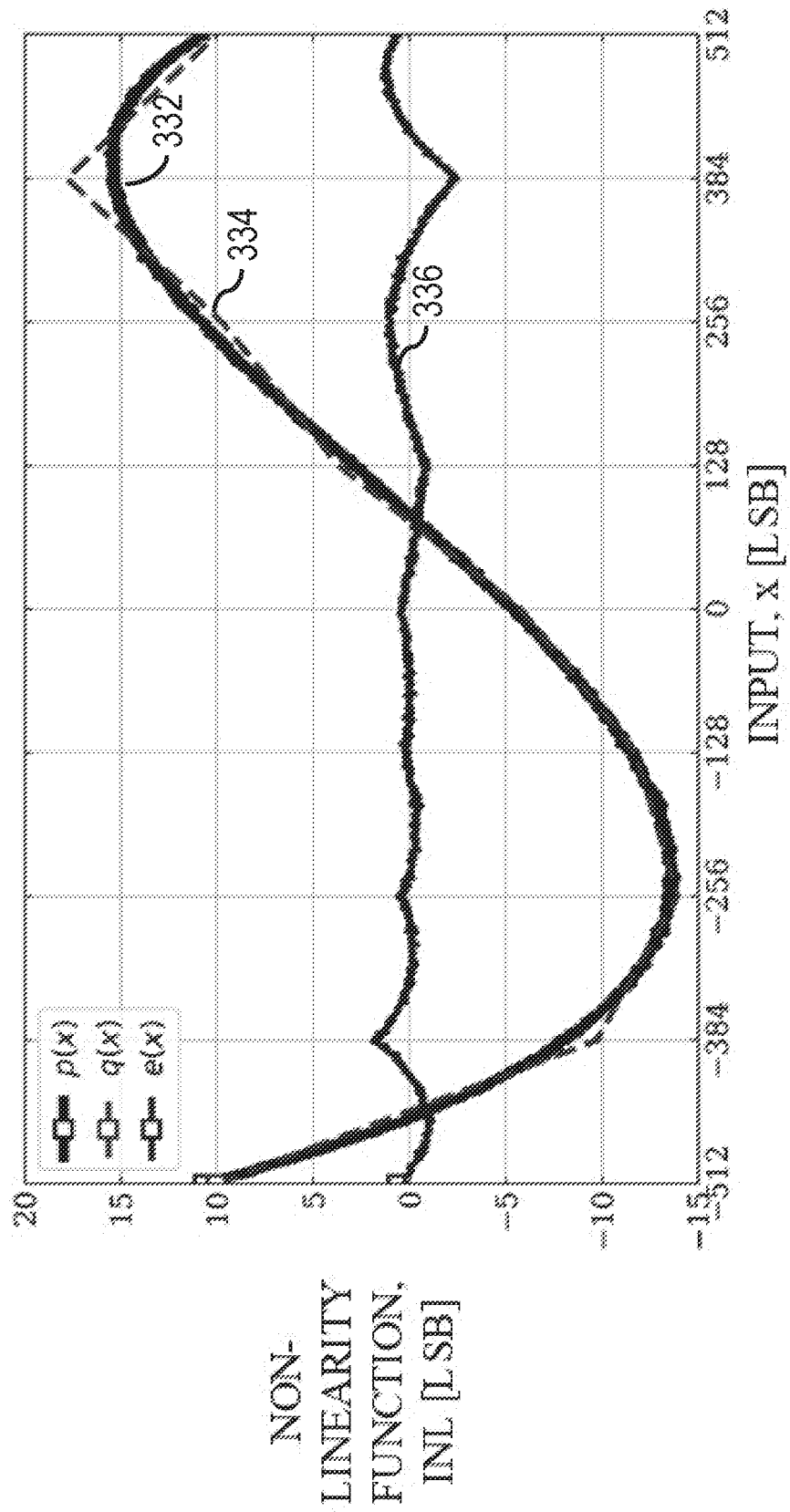
FIG. 15 shows simulation results of the LMS adaptation of the non-linearity identification and compensation of FIG. 14 using a Walsh Hadamard (WH) kernels set and interpolation for N=8.

FIG. 15 shows simulation results of the LMS adaptation of the non-linearity identification and compensation of FIG. 14 using a Walsh Hadamard (WH) kernels set and interpolation. This simulation is for a 10-bit DAC with fifth-order INL characteristics p(x) with a 0.1 LSB random standard deviation using the WH kernels set (N=8) and interpolation.

Using interpolation and updating of LUT 314, as shown in FIG. 14, q(x), curve 334, is constructed from non-linear error function p(x), shown as curve 332. Curve 334 closely follows curve 332, so q(x) is close to p(x), resulting in a low error, curve 336.

Curve 336 shows that error e(x) varies from about +2 to −3. The RMS of error e(x), curve 336, in steady-state is about 0.66 LSB. This is about 4 times the compensation accuracy improvement compared to WH without interpolation and about the same compensation accuracy of TWH (N=8).

Figure 16:
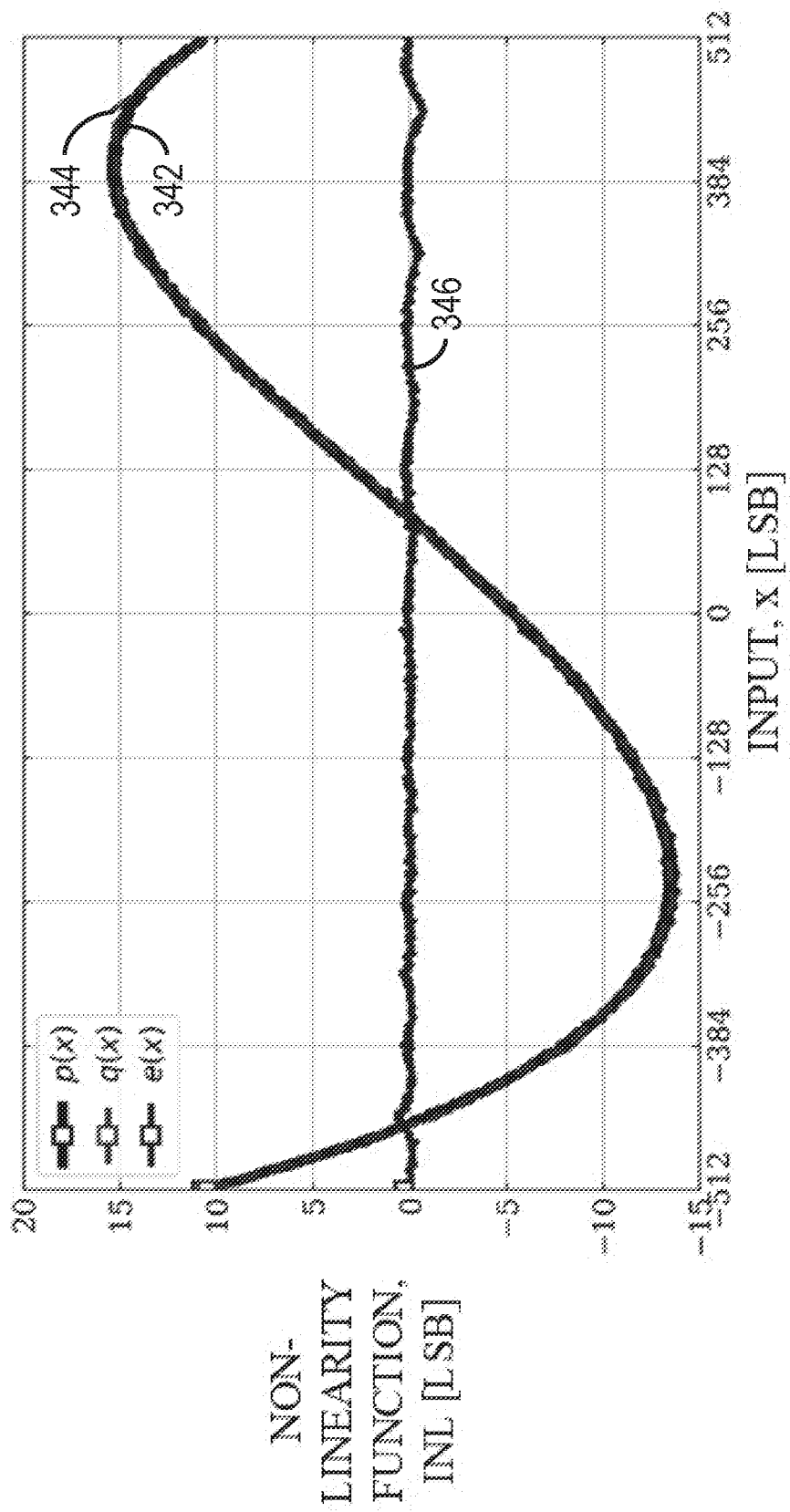
FIG. 16 shows simulation results of the LMS adaptation of the non-linearity identification and compensation of FIG. 14 using a Walsh Hadamard (WH) kernels set and interpolation for N=16.

FIG. 16 shows simulation results of the LMS adaptation of the non-linearity identification and compensation of FIG. 14 using a Walsh Hadamard (WH) kernels set and interpolation for N=16. Curves 342, 344 more closely match, causing error curve 346 to remain closer to zero. Using N=16, the RMS error can be reduced to 0.19 LSB. This is about 5 times the compensation accuracy improvement compared to WH without interpolation.

Figure 17:
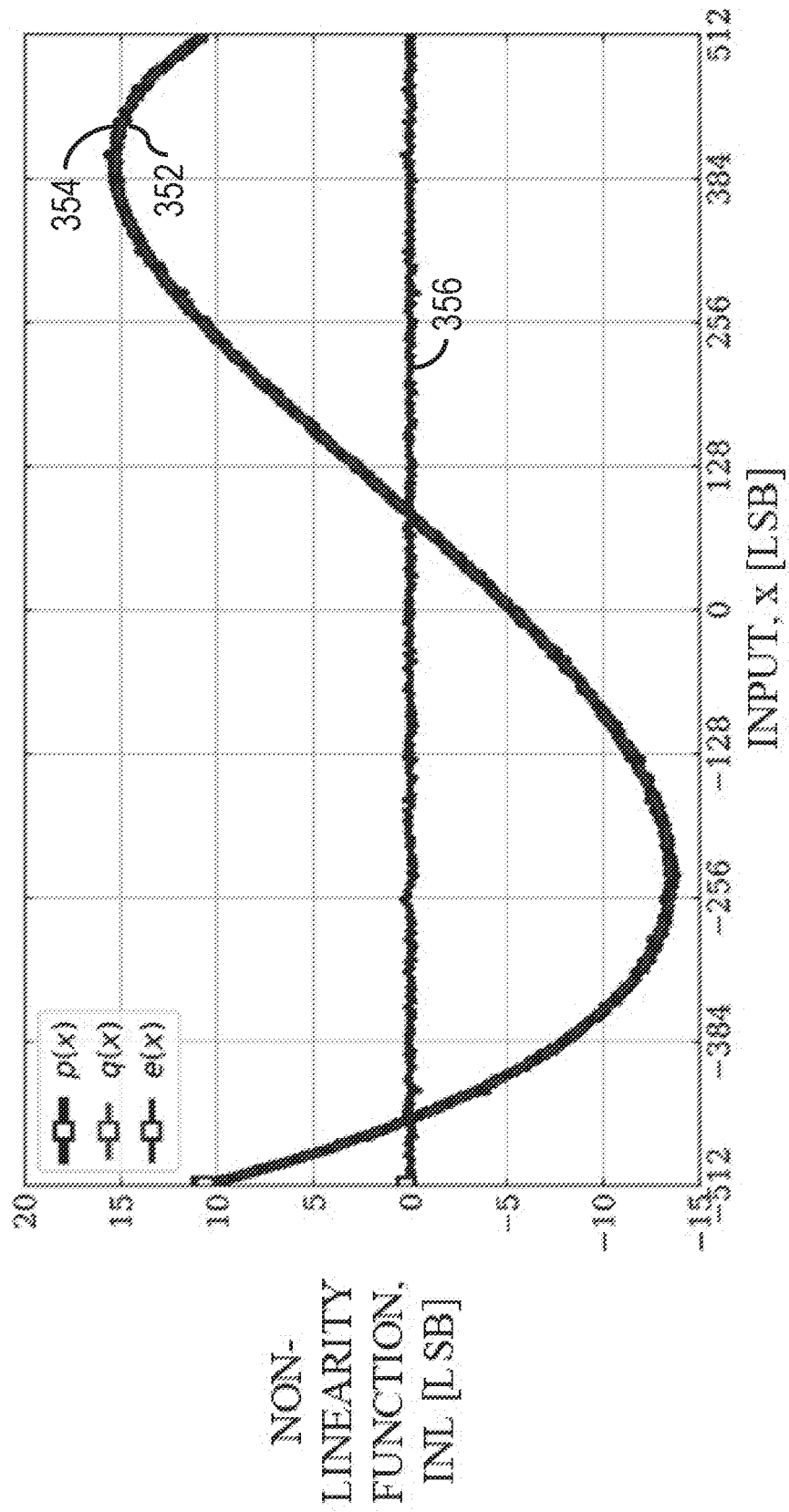
FIG. 17 shows simulation results of the LMS adaptation of the non-linearity identification and compensation of FIG. 14 using a Walsh Hadamard (WH) kernels set and interpolation for N=32.

FIG. 17 shows simulation results of the LMS adaptation of the non-linearity identification and compensation of FIG. 14 using a Walsh Hadamard (WH) kernels set and interpolation for N=32. Curves 352, 354 more closely match, causing error curve 356 to become almost flat. Using N=32, the RMS error can be reduced to 0.11 LSB. This is very close to the limit of 0.1 LSB random variations in p(x).

Applications

In this section, the inventor presents some examples of applications for the proposed adaptive INL identification and compensation techniques.

Figure 18:
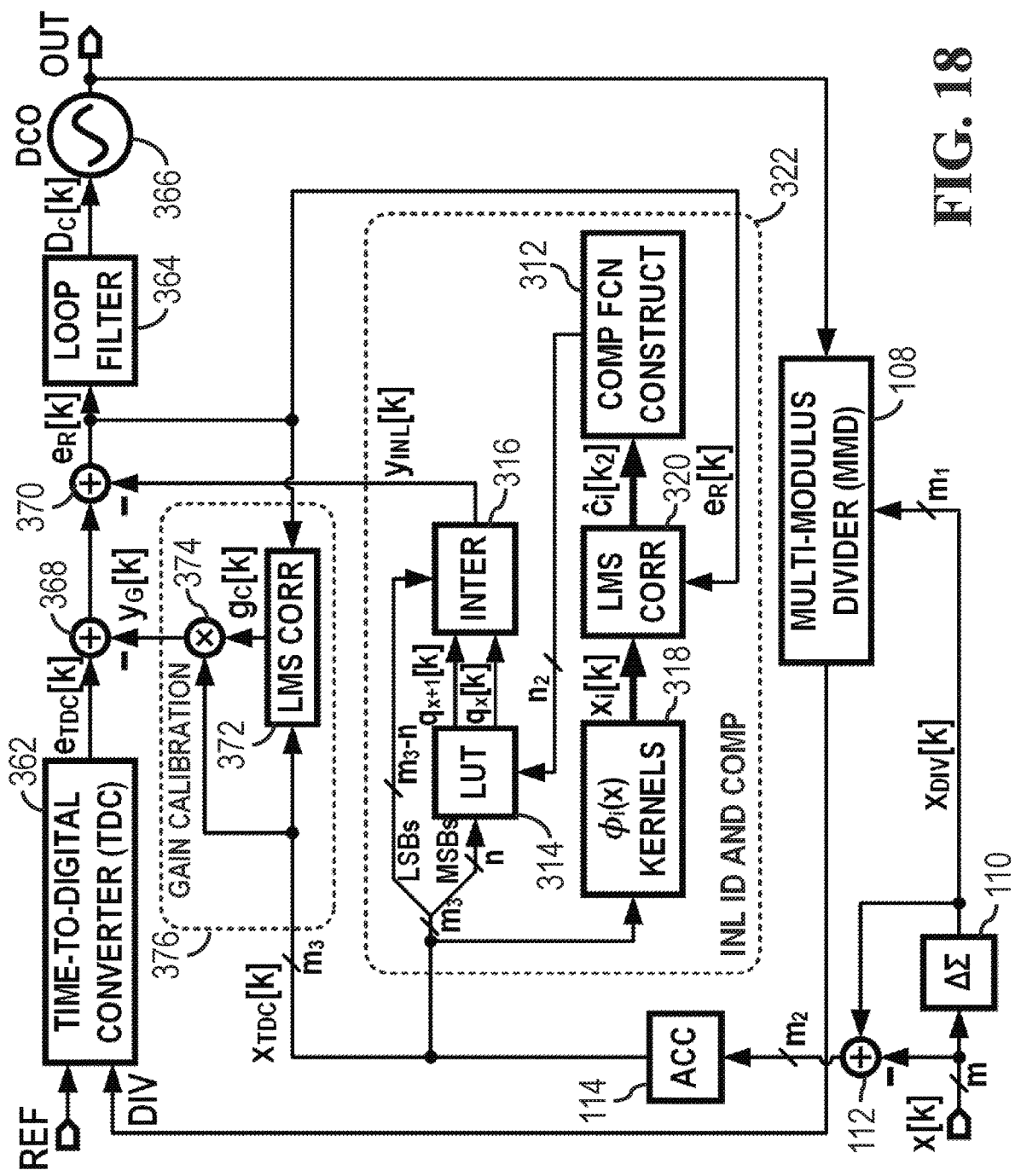
FIG. 18 shows a digital FN-PLL with TDC-based "digital-domain" $\Delta\Sigma$ quantization noise cancellation and adaptive TDC INL identification and compensation.

FIG. 18 shows a digital FN-PLL with TDC-based "digital-domain" $\Delta\Sigma$ quantization noise cancellation and adaptive TDC INL identification and compensation. Time-to-Digital Converter (TDC) 362 measures time difference between the reference clock REF and a divided feedback clock DIV. Multi-Modulus Divider (MMD) 108 generates divided feedback clock DIV using dithering.

TDC 362 outputs a digital word $e_{TDC}[k]$. Digital loop filter 364 digitally filters the output of TDC 362 after subtraction of error terms by adders 368, 370. Digital loop filter 364 generates a multi-bit digital control word, $D_C[k]$, that drives Digitally Controlled Oscillator (DCO) 366 towards phase and frequency lock in the loop.

Fractional-N operation is generated by dithering MMD 108 with $m_1$-bit $x_{DIV}[k]$, which is generated by truncating an m-bit (m>$m_1$) frequency control word x[k] by using digital $\Delta\Sigma$ modulator 110. Adder 112 subtracts the frequency control word x[k] from the output of $\Delta\Sigma$ modulator 110 to generate an $m_2$-bit quantization error that is accumulated by accumulator 114.

Output $e_{TDC}[k]$ of accumulator 114 is applied to gain calibrator 376, which generates the gain adjustment $y_G[k]$. subtracted from the PLL loop by adder 368. Gain calibrator 376 uses LMS correlator 372 to correlate the accumulated quantization error, $e_{TDC}[k]$, with the input to digital loop filter 364, residual error $e_R[k]$, with the output of LMS correlator 372 multiplied using multiplier 374 with the accumulated quantization error, $e_{TDC}[k]$, to generate the gain adjustment $y_G[k]$.

INL identification and compensation 322 also receives the accumulated quantization error, $e_{TDC}[k]$, from accumulator 114. Kernels 318, LMS correlator 320, and compensation function constructor 312 operate on the input from accumulator 114 to generate updates to entries in LUT 314, as shown and described earlier for FIG. 14. The input from accumulator 114 is split into MSB and LSB sections, with the MSB's applied as the address input to LUT 314, while the LSB's control interpolator 316 to interpolate between two sequential entries in LUT 314. Interpolator 316 generates the interpolated adjustment, $y_{INL}[k]$, which is subtracted from the PLL loop by adder 370.

LMS correlator 320 in INL identification and compensation 322 and LMS correlator 372 in gain calibrator 376 both receive residual error $e_R[k]$ that is input to digital loop filter 364. DCO 366 output OUT is fed back to Multi-Modulus Divider (MMD) 108 to generate the divided clock DIV. MMD 108 can be a $\Delta\Sigma$ fractional divider in the feedback path. DCO 366 generates an output signal, OUT, of frequency $F_{OUT}=(N_{DIV}+\alpha_{DIV})F_{REF}$, where $N_{DIV}$ is a positive integer, $\alpha_{DIV}$ is a fractional value between 0 and 1, and $F_{REF}$ is the frequency of the reference clock signal REF. Fractional-N operation is achieved by dithering the feedback multi-modulus divider MMD 108 using $\Delta\Sigma$ modulator 110, where the average of the dithered signal $x_{DIV}[k]$ corresponds to the desired fractional factor $\alpha_{DIV}$.

The $m_2$-bit quantization error is filtered by the low pass filtering characteristic of the PLL. However, it is common knowledge that a PLL suffers from a conflicting bandwidth tradeoff. For example, DCO phase noise suppression requires large bandwidth while a low bandwidth is needed to effectively suppress $\Delta\Sigma$ quantization noise error. In view of these tradeoffs, the impact of $\Delta\Sigma$ quantization noise error on output phase noise is reduced by cancelling it at the output of the TDC. The effectiveness of this approach greatly depends on the gain and non-linearity characteristic of the TDC.

While gain calibration using LMS correlation technique is reported in the prior-art, it is insufficient to adequately suppress the $\Delta\Sigma$ quantization noise error to levels that are mandated by many applications. The dynamic range of TDC 362 must at least be as large as one DCO period when the fractional divider is dithered by a first order $\Delta\Sigma$ modulator and several DCO periods for higher order $\Delta\Sigma$ modulators. Increasing TDC dynamic range severely degrades its linearity performance. The non-linearity identification and compensation circuit of FIG. 18 accurately estimates and compensate TDC non-linearity at its output and greatly enhances $\Delta\Sigma$ quantization noise cancellation accuracy.

Figure 19:
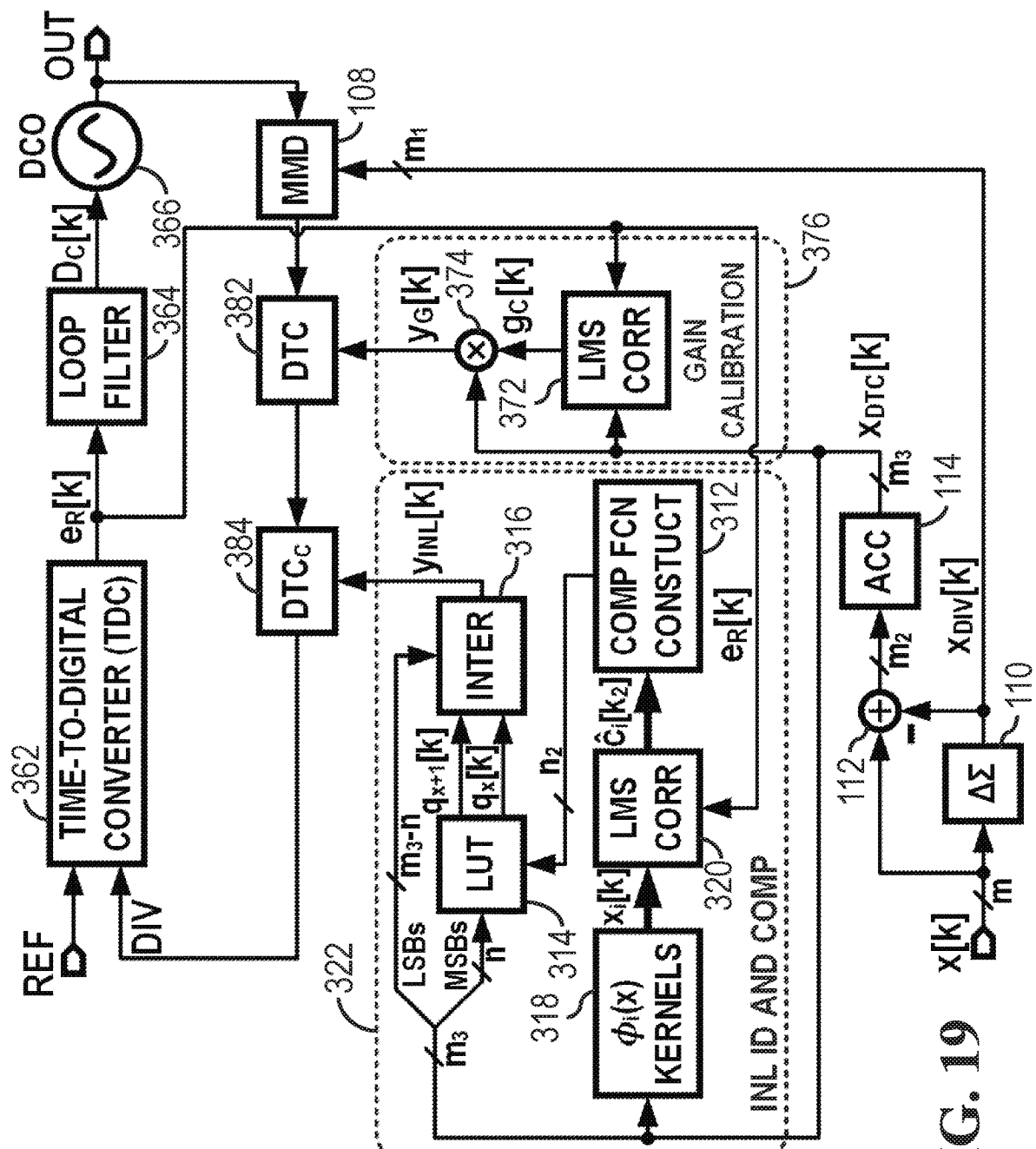
FIG. 19 is a block diagram of another digital FN-PLL architecture where the $\Delta\Sigma$ quantization noise cancellation and adaptive INL identification and compensation is performed in the "time-domain" using a Digital-to-Time Converter (DTC).

FIG. 19 is a block diagram of another digital FN-PLL architecture where the ΔΣ quantization noise cancellation is performed in the "time-domain" using a Digital-to-Time Converter (DTC). Main DTC 382 and compensation DTC$_C$ 384 in the feedback path are used to cancel the quantization noise at the output of the fractional divider, MMD 108. As a result, the dynamic range requirement of TDC 362 is significantly relaxed. The DTC gain is calibrated by gain calibrator 376 using LMS correlation technique and subtracted from the loop by DTC 382. Likewise, INL compensation is performed by INL identification and compensation 322 to generate the interpolated adjustment, y$_{INL}$[k], which is subtracted from the PLL loop by compensation DTC$_C$ 384. The components and functions of INL identification and compensation 322, gain calibrator 376, and ΔΣ modulator 110 are as described before for FIG. 18.

DTC 382 and DTC$_C$ 384 can be any digitally-controlled delay element, such as a digitally-controlled delay line, a voltage-controlled delay line with a DAC, a phase rotator, a phase interpolator, a multi-phase generator with phase selector, a multi-phase delay locked loop (DLL) with a programmable delay or a phase selector.

However, the effectiveness of this approach is also limited by the DTC non-linearity. This embodiment of the adaptive DTC INL identification and compensation scheme compensates DTC INL in the "time-domain" using a narrow range linear compensation (DTC$_C$). As a result, it greatly improves the ΔΣ quantization noise cancellation accuracy, thereby enabling ultra-low noise and spurs at the synthesizer output.

Figure 20:
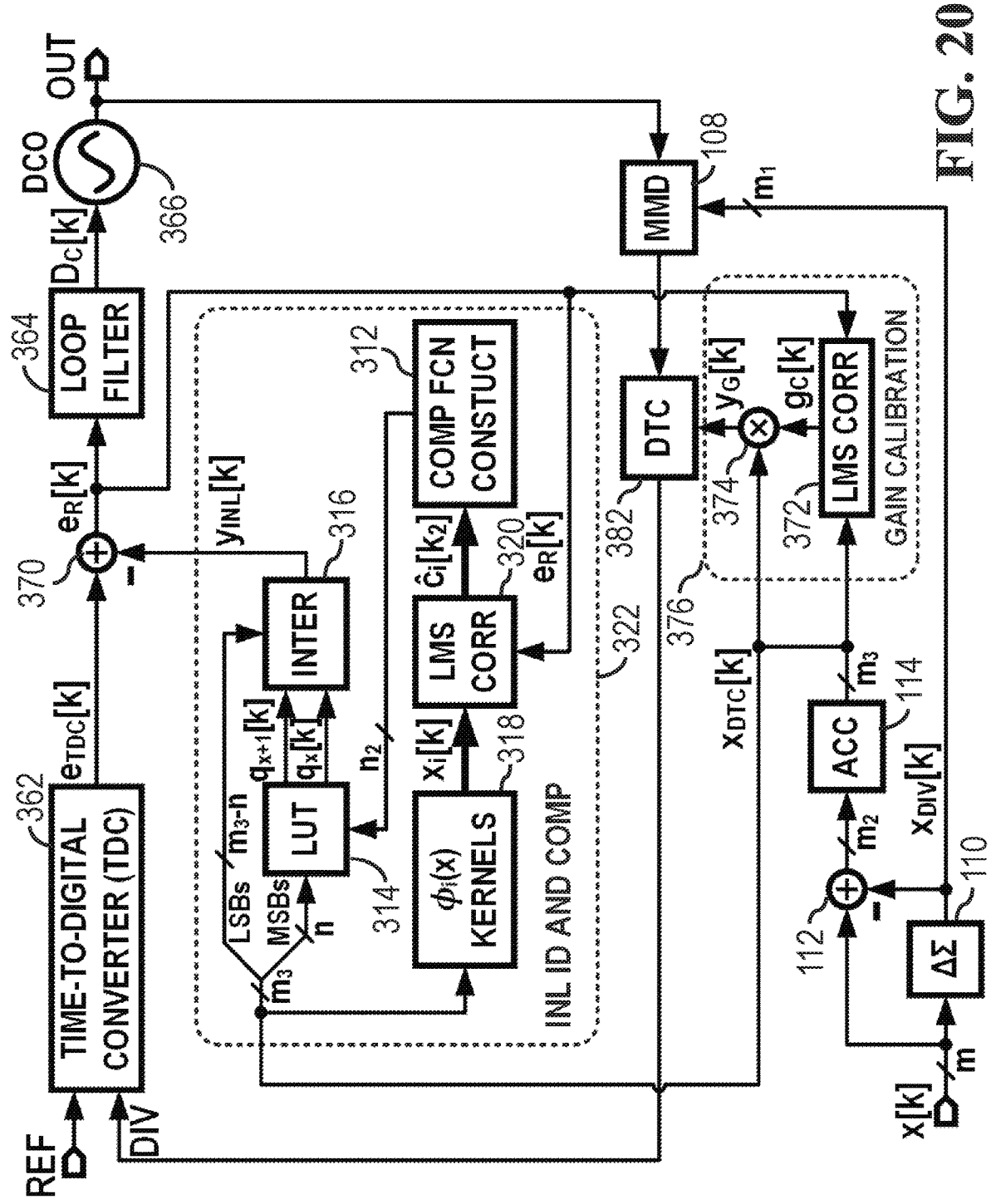
FIG. 20 is a block diagram of another digital FN-PLL architecture where the $\Delta\Sigma$ quantization noise cancellation is performed in the "time-domain" while the INL identification and compensation is in the "digital-domain".

FIG. 20 is a block diagram of another digital FN-PLL architecture where the ΔΣ quantization noise cancellation is performed in the "time-domain" while the INL identification and compensation is in the "digital-domain". In this hybrid embodiment, INL identification and compensation 322 has interpolator 316 generate the interpolated adjustment, y$_{INL}$[k], which is subtracted from the PLL loop by adder 370. The interpolated adjustment, y$_{INL}$[k], is a multi-bit digital value, as is the input to digital loop filter 364 and input to DCO 366. INL compensation occurs in the "digital-domain" at the output of the TDC. INL identification and compensation 322 operates as described in FIG. 18.

Gain calibrator 376 is connected as described in FIG. 19. The DTC gain is calibrated by gain calibrator 376 using the LMS correlation technique and subtracted from the loop by DTC 382. This gain calibration is subtracted from the PLL loop after conversion by DTC 382 into the "time-domain".

Alternate Embodiments

Several other embodiments are contemplated by the inventor. For example, many kinds and arrangements of analog detectors, filters, oscillators, adders, DAC's, and digital processors, function units, logic gates, and logic structures are possible. Various encodings, transforms, and alterations to data and signals may be performed at different stages, and for a variety of reasons. Functional units, blocks, and other components may be shared and used for several purposes. Various initialization and start-up procedures or circuits could be added, or power-down circuits and routines.

Some embodiments disclosed herein are applicable to any ΔΣ FN-PLL, such as analog, digital, or hybrid. FN-PLLs may be used for frequency synthesis, phase modulation and demodulation, clock generation, clock and data recovery, jitter attenuators, and phase synchronization. The output clock OUT may be encoded with data for transmission. Some embodiments presented in this disclosure are particularly suited for applications with stringent phase noise and spurious performance requirements.

Error corrections or adjustments may be added to the loop in the time domain or in the digital domain, or in a combination such as shown in FIG. 20. Various conversions between domains is possible. Compensation may be performed in time, digital, voltage, or current domains, and in various locations in the PLL or other loop, network, or circuit. Function p (x) generator 132 has been described as representing the non-linear error generated by an m-bit DAC. However, the error may be generated by a DTC (Digital-to-Time Converter) or a PI (Phase Interpolator) where the input signal is in digital form and the output is voltage, time, phase, or other signal form. Generally, similar concepts and techniques can be applied to other analog circuits, such as an ADC (Analog-to-Digital Converter), although modifications may be added because the ADC input signal is analog not digital. So then kernels blocks 141, 142, . . . 144 process an analog input signal (voltage, time, phase, . . . etc.) to generate x$_i$[k] signals. Using constant-piece wise kernels as BP, Haar, or WH, this implementation can still use simple comparators. This can be a significant advantage when using the inventor's approach of constant piece-wise and interpolation in ADCs and other mixed-signal or analog circuits.

DTC 382, 384 can be any digitally-controlled-delay element, such as a digitally-controlled delay line, a phase rotator, or a phase interpolator. TDC 362 can compare the phases of REF and DIV and generate a multi-bit digital value directly or may use a charge pump to generate an analog voltage that is then converted by and ADC to a digital value.

A Digital-Signal Processor (DSP) may be used for some functions. The DSP may be part of a larger system that is controlled by a Central Processing Unit (CPU) that may have a microprocessor that controls a DSP, signal processing blocks, circuits, or other enhancements such as a pipeline to process signals. The CPU can execute instructions stored in memory to perform the operations. Inputs, outputs, and intermediate results may be stored in one or more memories. Data signals that are converted to digital values may be stored in a memory for processing by a CPU or a DSP, which may use lookup tables or a specialized processor or data pipeline to accumulate values, modulate, perform kernel operations, LMS correlation, compensation function constructor, fast iWHT, interpolation, multiplication and addition/subtraction. A general-purpose programmable DSP may be used for prototyping and development, then a faster DSP with dedicated hardware may be used for production. Purpose-built or custom DSP blocks and other hardware may be used for some or all components, while a more generic DSP may be used for other components, especially non-speed-critical blocks. Field-Programmable Gate-Array (FPGA) or other semi-custom blocks may also be used, either initially for prototypes or later for production devices. The invention may also be implemented with an Application-Specific Integrated Circuit (ASIC) design, or other implementations. A mixed-signal IC may be used that includes the PLL blocks and DSP blocks for gain calibration and INL identification and compensation. The device may be digitally re-programmable, such as to support various modes of operation, initialization, testing, different bit widths of digital signals, different operating speeds, clock speeds, division factors for the feedback divider, etc.

Many embodiments of the non-linearity identification and compensation techniques described herein are applicable in general to many analog/mixed-signal/RF Integrated Circuit (IC) building blocks including but not limited to clock generators, Clock and Data Recovery (CDR), phase interpolators, voltage/current amplifiers, Transimpedance Amplifiers (TIAs), and Power Amplifiers (PAs).

Additional components may be added at various nodes, such as resistors, capacitors, inductors, transistors, extra buffering, etc., and parasitic components may also be present. Enabling and disabling the circuit could be accomplished with additional transistors or in other ways. Pass-gate transistors or transmission gates could be added for isolation. Filters may be added. While a fast iWHT process has been described, other inverse transforms could be substituted or altered. For example, fast Fourier Transforms and inverse Fourier transforms may be used, especially during the design and prototyping phase, and later reduced in complexity for iWHT.

Figure 1:
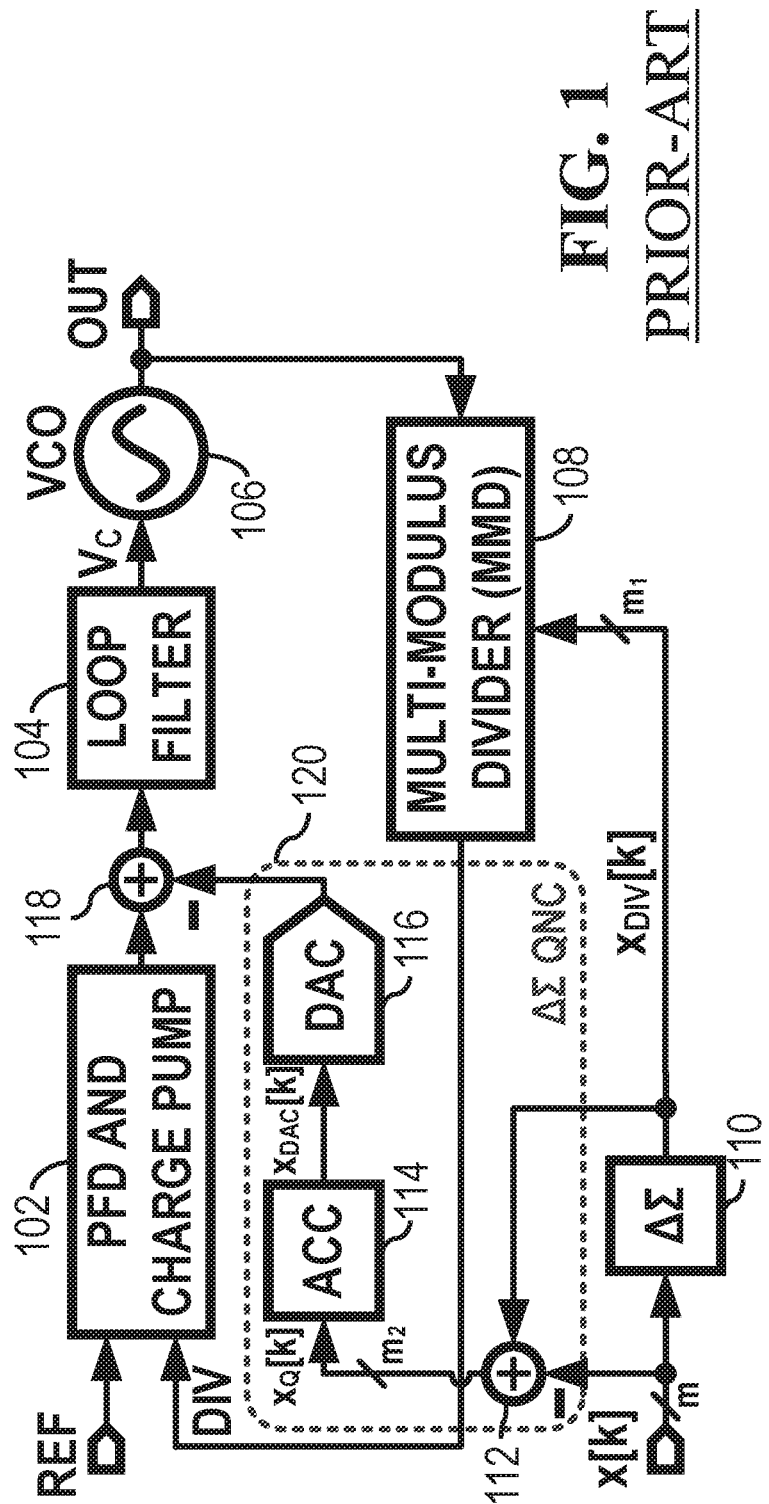
FIG. 1 shows a prior-art analog FN-PLL.

The kernel coefficients $\hat{c}_i$, can be set adaptively or non-adaptively. The coefficients can be set using pre-set values either under manual or computer or program control. At other times the coefficients may be adaptively generated using the LMS correlator. The LMS correlator can be used only on startup and later turned off after the residual error is below a certain threshold or after a pre-set period. The LMS correlator can be turned on again after a pre-determined period of time has elapsed to track Temperature and Supply Voltage variations. The LMS correlator may be turned on again after the residual error is above certain threshold. Thus, adaptive coefficient generation can be used only on startup, or when the residual error is large, with the coefficients stored in the lookup table remaining unchanged when the LMS correlator is turned off. The orthogonal kernel generator and compensation function constructor and other related blocks may also be turned off when the LMS correlator is turned off. Some PLL blocks could be implemented in the digital domain or in the analog domain or in the time domain. For example, in FIG. 19, loop filter 364 has been described as digital-domain blocks. Loop filter 364 receives a multi-bit digital value for the phase error $e_R[k]$, and generates a digital control value $D_C[k]$ to control the frequency of oscillation of DCO 366. OUT, DIV, and REF are clocks having phase information indicated by the relative phase offsets to their rising clock edges. However, TDC 362, digital loop filter 364, and DCO 366 could be replaced with their analog-domain equivalents, for example FIG. 1's Phase-Frequency-Detector and Charge Pump, PFD/CP 102, loop filter 104 that generates an analog control voltage to control VCO 106. The digital value for the gain adjustment from gain calibrator 376 and INL adjustments from INL identification and compensation 322 could be converted to analog values and added by one or more adders, such as adder 118 of FIG. 1. A time-domain error at the input to the loop filter or at another location could be converted to a digital value of phase error $e_R[k]$.

In another alternative, TDC 362 contains a charge pump and an Analog-to-Digital Converter (ADC). In this alternative, TDC 362 measures the time or phase difference between rising edges of clocks REF, DIV, and activates the charge pump to charge or discharge a capacitor in TDC 362. Then the capacitor voltage is converted by the ADC to a digital value that is input to loop filter 364, or one of adders 368, 370.

In still another embodiment, TDC 362 could be PFD/CP 102 without a capacitor or ADC. Then loop filter 364 could be an analog capacitor (loop filter 104) with an ADC that converts the capacitor voltage Vc to digital control value $D_C[k]$ to control the frequency of oscillation of DCO 366. Other combinations and variations are possible.

While Least-Mean Square (LMS) has been described, other steepest-gradient methods may be substituted, such as Recursive Least squares (RLS), and modifications of LMS, RLS, or other methods.

While separate subtractors 368, 370 in series have been shown, subtractors could be in series or both adjustments could be summed first and then only the sum of the adjustment is subtracted in a single subtractor in the PLL loop.

Kernels $\phi_i(x)$ are said to be orthogonal in the interval $-x_p \leq x \leq +x_p$ if they satisfy:

$$\int_{-x_p}^{x_p} \phi_i(x)\phi_j(x)dx = \begin{cases} 0 & \text{for } i \neq j \\ A & \text{for } i = j \end{cases} \quad (31)$$

where A is a constant. Orthogonal kernels may be defined using equation (3).

The + and − inputs to adder 112 may be reversed.

The orthogonal kernel generator may generate a complete set or an incomplete set of orthogonal kernels. The orthogonal kernel generator may generate polynomials kernels, linear piece-wise kernels, or constant piece-wise kernels. Polynomials kernels may include Laguerre polynomials, Hermite polynomials, and Jacobi polynomials such as Legendre, Chebyshev, and Gegenbauer polynomials. Constant piece-wise kernels may include block-pulse (BP), Haar, and Walsh Hadamard (WH) kernels. The WH kernel set includes one kernel that has a non-zero, constant DC bias, while other WH kernels have a net zero DC bias over a range of the input signal and each can have only two output values. Linear piece-wise kernels include Triangular Walsh Hadamard (TWH) kernels. The TWH kernel set includes one kernel that has a constant DC bias, while other TWH kernels have a net zero DC bias over a range of the input signal.

The background of the invention section may contain background information about the problem or environment of the invention rather than describe prior art by others. Thus, inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An Integrated Circuit (IC) comprising:
a mixed-signal circuit that generates a non-linear error when generating an output, the mixed-signal circuit being modulated at least in part by an input signal;
a non-linear-error subtractor for subtracting a non-linearity compensation signal from an internal signal within the mixed-signal circuit to compensate for the non-linear error and to generate a residual error;
an Integral Non-Linearity (INL) identification and compensation circuit that receives the input signal and generates the non-linearity compensation signal, wherein the INL identification and compensation circuit comprises:
a lookup table for storing INL compensation results, the INL compensation results being pre-computed results of a compensation function operating upon the input signal;
an interpolator that receives two INL compensation results that are read from the lookup table in response to more-significant bits of the input signal, the interpolator using at least one lower-significant bit of the input signal to interpolate between the two INL compensation results read from the lookup table to generate the non-linearity compensation signal;
an orthogonal kernel generator that receives the input signal and generates a plurality of orthogonal kernel signals from the input signal;
an error correlator having a plurality of paths, wherein each path in the plurality of paths correlates the residual error to an orthogonal kernel signal in the plurality of orthogonal kernels generated by the orthogonal kernel generator, the error correlator generating adaptive coefficients using the plurality of paths; and
a compensation function constructor that receives the adaptive coefficients from the error correlator and performs an inverse transform to generate an updated compensation function, the updated compensation function being used to generate updated results that over-write the INL compensation results in the lookup table;
whereby INL errors within the mixed-signal circuit are identified and adaptively compensated for by subtracting the non-linearity compensation signal.

2. The IC of claim 1 further comprising:
pre-set coefficients for input to the compensation function constructor;
wherein when the pre-set coefficients are input to the compensation function constructor, the compensation function constructor uses the pre-set coefficients in place of the adaptive coefficients to generate the updated compensation function;
wherein the error correlator is activated to generate the adaptive coefficients periodically, when the residual error is above a threshold, or when temperature or supply voltage variations occur,
whereby pre-set coefficients and adaptive coefficients are used at different times to generate the INL compensation results that are written into the lookup table.

3. The IC of claim 1 wherein the orthogonal kernel generator generates a plurality of Walsh Hadamard (WH) kernels;
wherein a first of the WH kernels has a constant non-zero DC bias for all values of the input signal;
wherein other WH kernels have a net zero DC bias over a range of the input signal and each have at least two states;
wherein temperature and supply voltage variations cause changes to the non-linear error;
wherein the error correlator adjusts the non-linearity compensation signal to compensate for changes in the non-linear error caused by the temperature and supply voltage variations.

4. The IC of claim 3 wherein the error correlator further comprises:
a plurality of multipliers each receiving the non-linear error;
a plurality of accumulators;
a plurality of decimation filters;
a plurality of paths through the error correlator, each path having a path kernel in the plurality of orthogonal kernels generated by the orthogonal kernel generator, the path kernel being multiplied by the residual error by a path multiplier in the plurality of multipliers to generate a path product, the path product being accumulated by a path accumulator in the plurality of accumulators to generate an accumulated path value, the accumulated path value being decimated by a path decimation filter in the plurality of decimation filters to generate an adaptive coefficient in the plurality of the adaptive coefficients;
wherein the error correlator is a Least-Mean Square (LMS) correlator,
whereby each of the plurality of orthogonal kernels has a corresponding path in the plurality of paths through the error correlator.

5. The IC of claim 1 wherein the mixed-signal circuit further comprises:
an oscillator that generates an output having a frequency determined by a control input to the oscillator;
a feedback divider for dividing a frequency of the output in response to a divisor input signal to generate a feedback clock;
a phase detector for comparing the feedback clock to a reference clock to generate a phase difference; and
a loop filter coupled between the phase detector and the oscillator, wherein the residual error is sampled from an input to the loop filter, the loop filter generating the control input to the oscillator;
a delta-sigma modulator that receives a modulator control word and generates the divisor input signal to the feedback divider;
a modulator subtractor that generates a difference of the modulator control word and the divisor input signal; and
a modulator accumulator that accumulates differences generated by the modulator subtractor to generate the input signal;
wherein the feedback divider is a Multi-Modulus Divider (MMD) and the mixed-signal circuit is a fractional-N PLL that generates an output from the oscillator with a frequency $F_{OUT}=(N_{DIV}+\alpha_{DIV})F_{REF}$, wherein $N_{DIV}$ is a positive integer, $\alpha_{DIV}$ is a fractional value between 0 and 1 that corresponds to an average of dithering, and $F_{OUT}$ is a frequency of the output, and $F_{REF}$ is a frequency of the reference clock.

6. The IC of claim 5 wherein the phase detector generates a digital value for the phase difference;
wherein the loop filter is a digital filter;
wherein the control input to the oscillator carries a digital value generated by the loop filter;
wherein the oscillator is a Digitally Controlled Oscillator (DCO).

7. The IC of claim 5 further comprising:
a gain calibrator having a second error correlator that correlates the input signal to the residual error to generate a gain calibration factor;
a gain adjustment multiplier that multiplies the input signal with the gain calibration factor to generate a gain-adjusted phase-control signal; and
a second subtractor that subtracts the gain-adjusted phase-control signal from a second internal signal in the mixed-signal circuit to cancel fractional divider phase quantization noise.

8. The IC of claim 7 wherein the non-linear-error subtractor is a digital subtractor coupled between the phase detector and the loop filter;
wherein the second subtractor is a digital subtractor is coupled in series with the non-linear-error subtractor.

9. The IC of claim 7 wherein the non-linear-error subtractor is a first Digital-to-Time Converter that converts the non-linearity compensation signal from a digital value to a time adjustment that is applied to the feedback clock;
wherein the second subtractor is a second Digital-to-Time Converter that converts the gain-adjusted phase-control signal from a digital value to a time adjustment that is applied to the second internal signal;
wherein the first Digital-to-Time Converter and the second Digital-to-Time Converter are in series between the feedback divider and the phase detector.

10. The IC of claim 7 wherein the non-linear-error subtractor is a digital subtractor coupled between the phase detector and the loop filter;
wherein the second subtractor is a Digital-to-Time Converter that converts the gain-adjusted phase-control signal from a digital value to a time adjustment that is applied to the second internal signal;
wherein the Digital-to-Time Converter is coupled between the feedback divider and the phase detector;
wherein the Digital-to-Time Converter is a digitally-controlled delay element, a digitally-controlled delay line, a voltage-controlled delay line with a Digital-to-Analog Converter (DAC), a phase rotator, a phase interpolator, a multi-phase generator with a phase selector, a multi-phase Delay Locked Loop (DLL) with a programmable delay or a phase selector.

11. A fractional-N Phase-Locked Loop (PLL) with non-linear-error correction comprising:
a Time-to-Digital Converter (TDC) that receives a reference clock and a feedback clock and generates a TDC output, the TDC output being a digital value of a phase difference detected by the TDC between the reference clock and the feedback clock;
a loop filter that receives a residual error signal and generates an oscillator control signal by applying a digital filter to the residual error signal;
an oscillator that is controlled by the oscillator control signal and generates an output clock having a frequency determined by the oscillator control signal;
a feedback divider that divides the output clock by a divisor to generate a divided clock;
a modulator that generates a modulation signal to the feedback divider, the modulation signal dithering the divisor of the feedback divider to divide the output clock by an effective divisor with both an integer part and a fractional part, the fractional part being between 0 and 1;
a modulation accumulator that accumulates differences in the modulation signal to generate a phase control signal that is an accumulated quantized error of the modulator;
a gain calibrator that receives the residual error signal and the phase control signal, the gain calibrator minimizing an error to generate a gain adjustment;
a gain subtractor that subtracts the gain adjustment from a first signal in the PLL to cancel fractional divider phase quantization noise;
a non-linear-error subtractor that subtracts a non-linear-error adjustment from a second signal in the PLL to compensate for non-linear errors that are not compensated for by the gain adjustment;
an orthogonal kernel generator that receives the phase control signal and generates a plurality of orthogonal kernels from the phase control signal;
a correlator with a plurality of paths, wherein each path correlates an orthogonal kernel signal generated by the orthogonal kernel generator to the residual error signal to set a corresponding kernel coefficient adaptively;
a compensation function constructor that receives a plurality of the corresponding kernel coefficient generated by the correlator and performs an inverse transform to generate an updated compensation function, the updated compensation function operating upon a range of values of the phase control signal to generate a plurality of result values;
a lookup table for storing a plurality of stored results, the stored results being the result values generated by the compensation function constructor and stored in the lookup table; and
an interpolator that receives two or more stored results read from the lookup table in response to most-significant bits (MSBs) of the phase control signal, the interpolator using at least one least-significant bit (LSB) of the phase control signal to interpolate between the two or more stored results read from the lookup table to generate the non-linear-error adjustment sent to the non-linear-error subtractor.

12. The fractional-N Phase-Locked Loop (PLL) with non-linear-error correction of claim 11 wherein the plurality of orthogonal kernels comprises Walsh Hadamard (WH) kernels.

13. The fractional-N Phase-Locked Loop (PLL) with non-linear-error correction of claim 12 wherein the gain subtractor and the non-linear-error subtractor each subtract from the TDC output to generate the residual error signal to the loop filter;
wherein the divided clock is the feedback clock.

14. The fractional-N Phase-Locked Loop (PLL) with non-linear-error correction of claim 12 wherein the non-linear-error subtractor comprises:
a first Digital-to-Time Converter (DTC) that is coupled between the divided clock and the feedback clock, the first DTC converting the non-linear-error adjustment from a digital signal to a time delay that is added to the divided clock to generate the feedback clock;
wherein the gain subtractor comprises:

a second Digital-to-Time Converter (DTC) that is also coupled between the divided clock and the feedback clock and in series with the first DTC, the second DTC converting the gain adjustment from a digital signal to a time delay that is added to the divided clock to generate the feedback clock;

wherein the TDC output is connected to the residual error signal to the loop filter.

15. The fractional-N Phase-Locked Loop (PLL) with non-linear-error correction of claim 12 wherein the non-linear-error subtractor is coupled between the TDC output and the loop filter, the non-linear-error subtractor subtracting the non-linear-error adjustment from the TDC output to generate the residual error signal to the loop filter, wherein the TDC output is the second signal;

wherein the gain subtractor comprises a Digital-to-Time Converter (DTC) that is coupled between the divided clock and the feedback clock, the DTC converting the gain adjustment from a digital signal to a time delay that is added to the divided clock to generate the feedback clock.

16. The fractional-N Phase-Locked Loop (PLL) with non-linear-error correction of claim 12 wherein the gain subtractor and the non-linear-error subtractor together comprise:

a pre-adder that adds the gain adjustment to the non-linear-error adjustment to generate a combined adjustment; and a first Digital-to-Time Converter (DTC) that is coupled between the divided clock and the feedback clock, the first DTC converting the combined adjustment from a digital signal to a time delay that is added to the divided clock to generate the feedback clock;

wherein the first signal and the second signal in the PLL are a same signal.

* * * * *